US012277634B2

(12) United States Patent
Shelman et al.

(10) Patent No.: US 12,277,634 B2
(45) Date of Patent: Apr. 15, 2025

(54) TECHNOLOGY FOR MANAGING GRAPHIC DESIGN USING METADATA RELATIONSHIPS

(71) Applicant: CIMPRESS SCHWEIZ GMBH, Winterthur (CH)

(72) Inventors: Paul Shelman, Lincoln, MA (US); Siyang Zhang, Lexington, MA (US); Johanna Bodnyk, Arlington, MA (US); Noah Portnoy, Cambridge, MA (US)

(73) Assignee: CIMPRESS SCHWEIZ GMBH, Winterthur (CH)

( * ) Notice: Subject to any disclaimer, the term of this patent is extended or adjusted under 35 U.S.C. 154(b) by 0 days.

(21) Appl. No.: 18/131,996

(22) Filed: Apr. 7, 2023

(65) Prior Publication Data

US 2023/0245361 A1    Aug. 3, 2023

Related U.S. Application Data

(63) Continuation of application No. 17/090,050, filed on Nov. 5, 2020, now Pat. No. 11,640,685, which is a
(Continued)

(51) Int. Cl.
*G06F 40/103*    (2020.01)
*G06F 3/04845*    (2022.01)
(Continued)

(52) U.S. Cl.
CPC .......... *G06T 11/60* (2013.01); *G06F 3/04845* (2013.01); *G06F 30/33* (2020.01);
(Continued)

(58) Field of Classification Search
None
See application file for complete search history.

(56) References Cited

U.S. PATENT DOCUMENTS

| 8,001,465 B2* | 8/2011 | Kudrolli | G06F 40/18 715/261 |
| 8,274,529 B1* | 9/2012 | Butler | G06F 40/103 345/619 |

(Continued)

OTHER PUBLICATIONS

Anil et al., "Automatic Text Location in Images and Video Frames" Pattern Recognition, vol. 31, Issue 12, Dec. 1998, pp. 2055-2076. (Year: 1998).*
(Continued)

*Primary Examiner* — Amelia L Tapp
(74) *Attorney, Agent, or Firm* — MARSHALL, GERSTEIN & BORUN LLP

(57) ABSTRACT

Systems and methods for managing graphic design using metadata relationships are described. According to certain aspects, an electronic device may display a visual design including a set of design elements, each of which may be contained within a corresponding container. The electronic device may receive a selection to spatially adjust a design element, and may determine a modification to the design element based an element behavior of the design element and/or a container behavior of the corresponding container. The electronic device may display, in the user interface, the design element reflecting the modification.

9 Claims, 23 Drawing Sheets

Related U.S. Application Data continuation of application No. 16/193,664, filed on Nov. 16, 2018, now Pat. No. 10,846,897.

(51) Int. Cl.
*G06F 30/33* (2020.01)
*G06F 40/106* (2020.01)
*G06T 11/60* (2006.01)

(52) U.S. Cl.
CPC .......... *G06F 40/103* (2020.01); *G06F 40/106* (2020.01); *G06T 2200/24* (2013.01)

(56) References Cited

U.S. PATENT DOCUMENTS

| | | | |
|---|---|---|---|
| 2005/0168782 A1* | 8/2005 | Kobashi | G06F 40/174 |
| | | | 358/1.18 |
| 2006/0197963 A1 | 9/2006 | Royal et al. | |
| 2007/0024909 A1 | 2/2007 | Hanechak | |
| 2008/0301546 A1 | 12/2008 | Moore et al. | |
| 2009/0138817 A1* | 5/2009 | Oron | G06F 16/9577 |
| | | | 715/788 |
| 2010/0185992 A1 | 7/2010 | Auerbach et al. | |
| 2011/0113323 A1* | 5/2011 | Fillion | G06F 40/131 |
| | | | 715/252 |
| 2011/0210986 A1 | 9/2011 | Goutsev et al. | |
| 2013/0290376 A1* | 10/2013 | Dong | G06F 40/177 |
| | | | 707/802 |
| 2013/0332869 A1 | 12/2013 | Ferry et al. | |
| 2015/0103079 A1 | 4/2015 | Khambanonda et al. | |
| 2017/0084002 A1 | 3/2017 | Parag et al. | |
| 2018/0046361 A1 | 2/2018 | Shah et al. | |
| 2018/0059919 A1 | 3/2018 | Wan et al. | |
| 2018/0276182 A1 | 9/2018 | O'Donovan | |
| 2018/0329597 A1 | 11/2018 | Sonnino et al. | |
| 2020/0089387 A1 | 3/2020 | Andersson et al. | |
| 2020/0089396 A1 | 3/2020 | Shrivastava et al. | |
| 2020/0160419 A1 | 5/2020 | Shelman et al. | |
| 2020/0160572 A1 | 5/2020 | Shelman et al. | |
| 2020/0160573 A1 | 5/2020 | Shelman et al. | |

OTHER PUBLICATIONS

Lienhart et al., "Localizing and segmenting text in images and videos," in IEEE Transactions on Circuits and Systems for Video Technology, vol. 12, No. 4, pp. 256-268, Apr. 2002. (Year: 2002).*

Hill et al., "Withindows: A Framework for Transitional Desktop and Immersive User Interfaces" IEEE Symposium on 3D User Interfaces 2008, copyright 2008 IEEE, p. 3-10. (Year: 2008).

Bederson et al., "Toolkit Design for Interactive Structured Graphics" IEEE Transactions on Software Engineering, vol. 30, No. 8, Aug. 2004, p. 535-546 (Year: 2004).

* cited by examiner

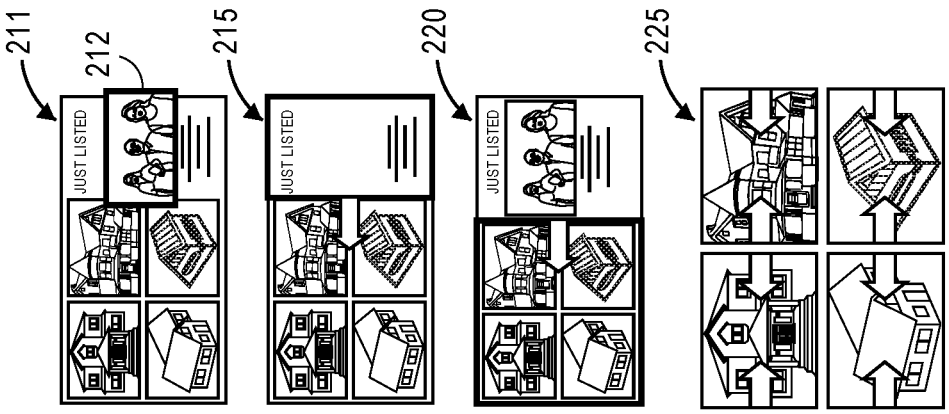
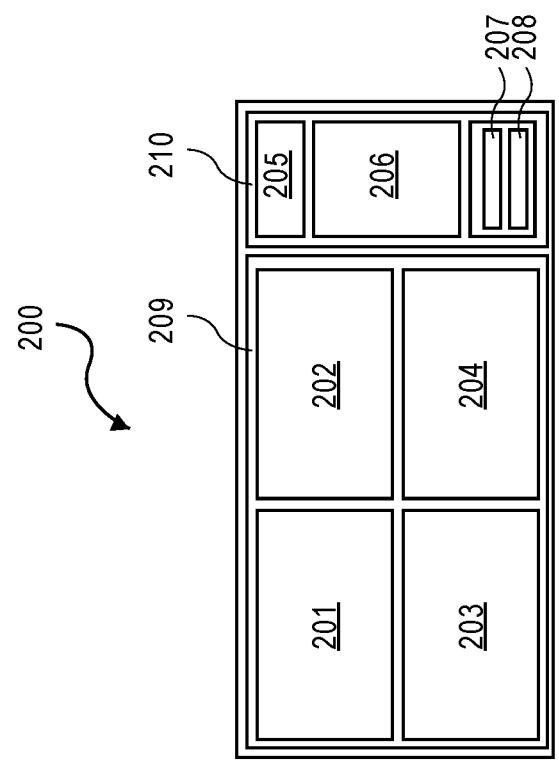
FIG. 2B
FIG. 2A

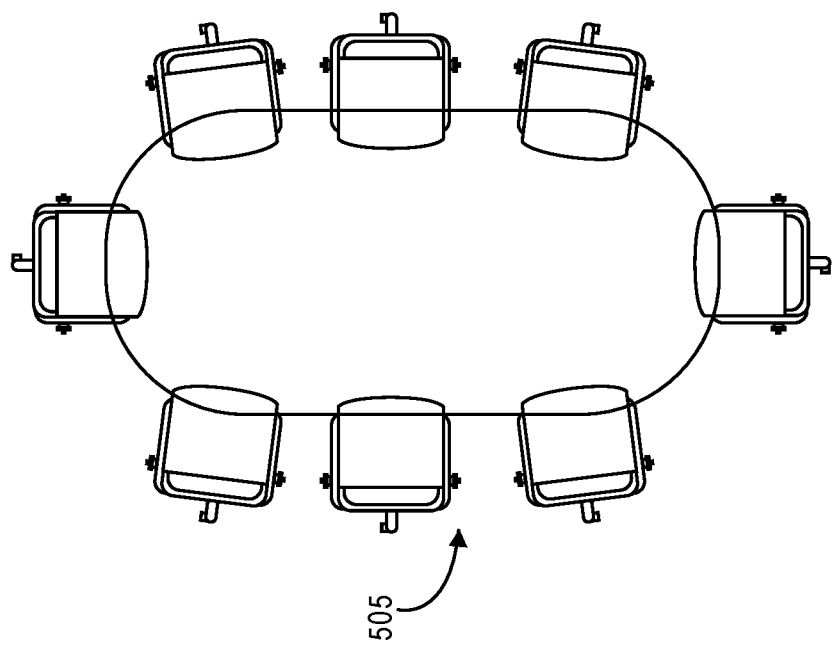
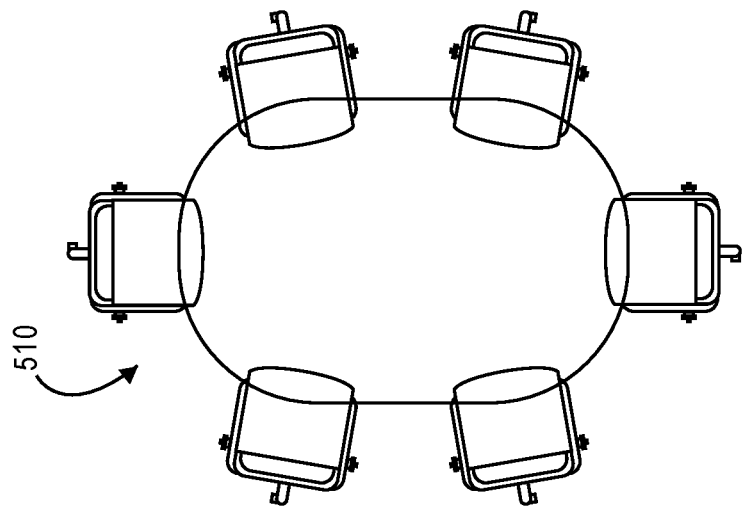
FIG. 5

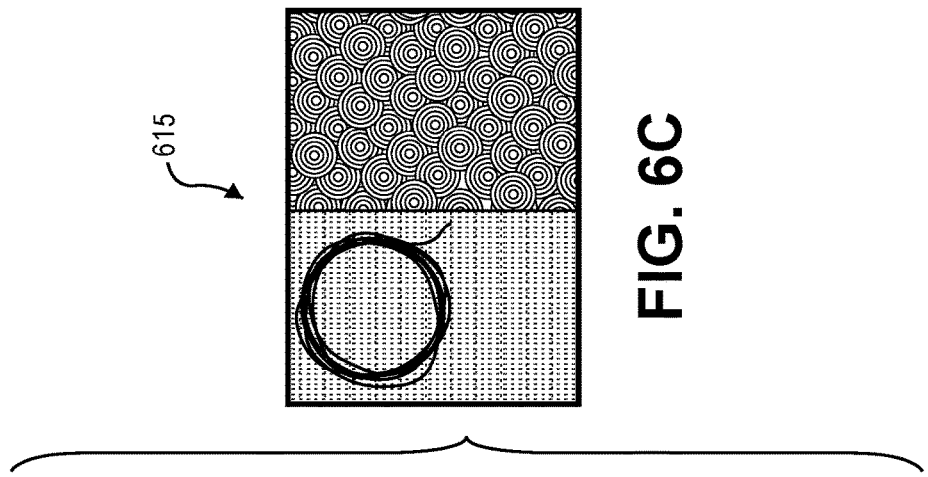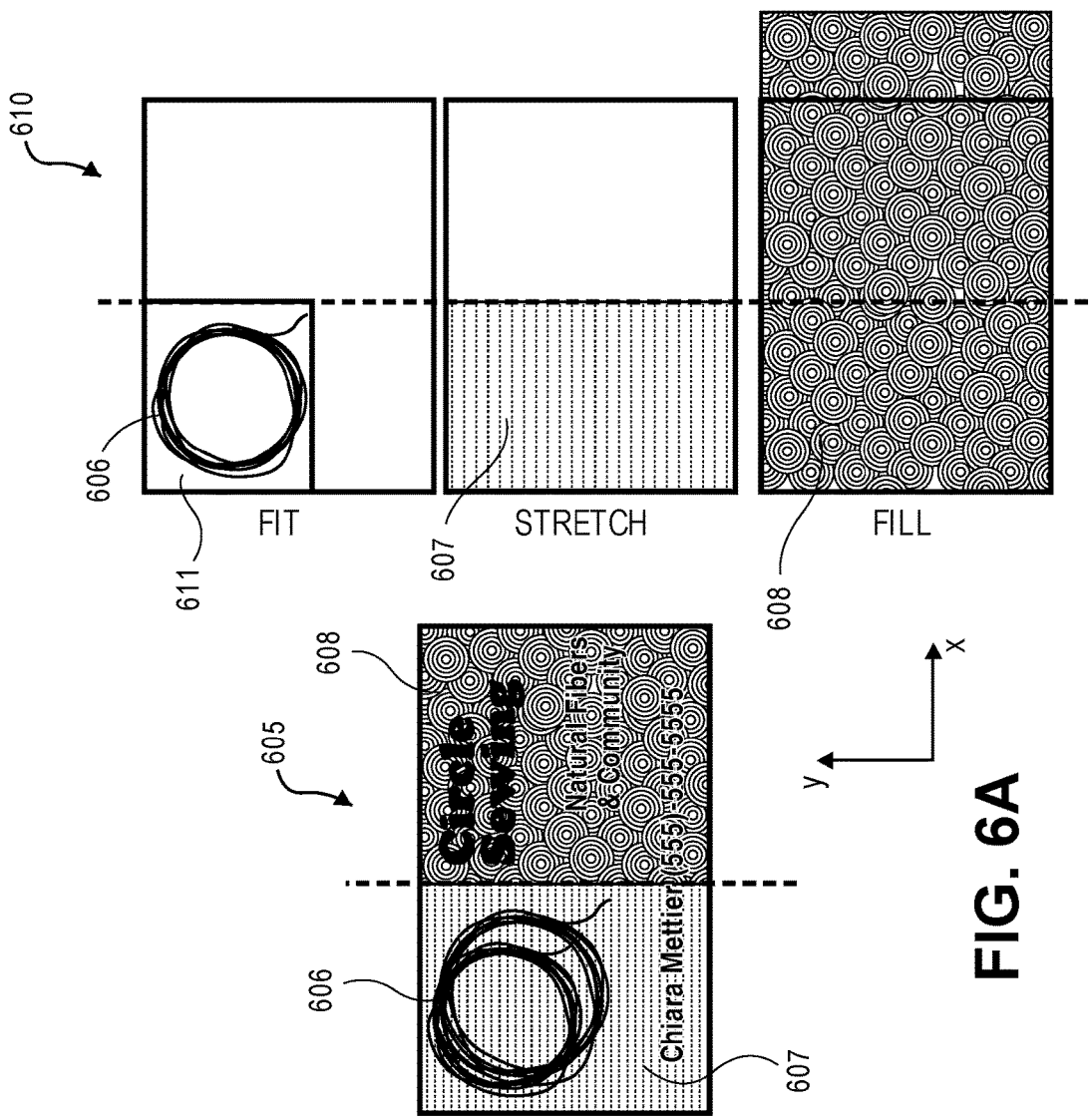

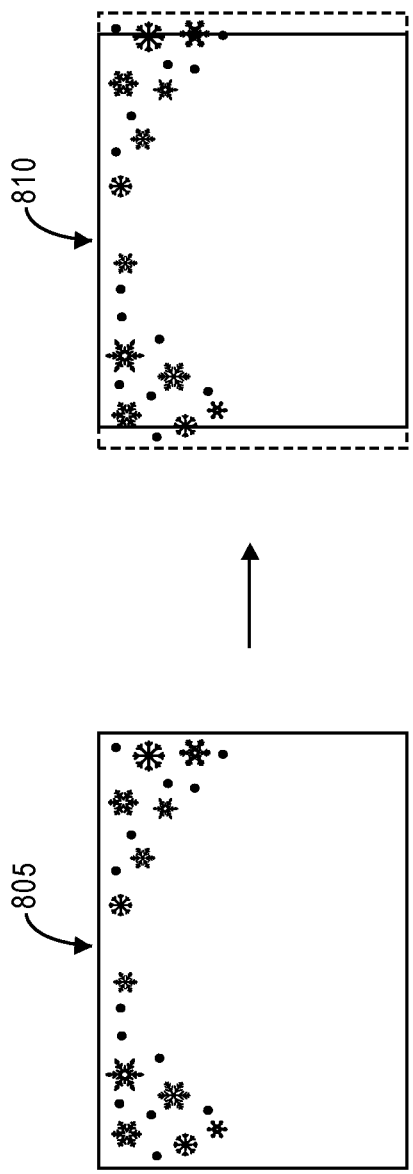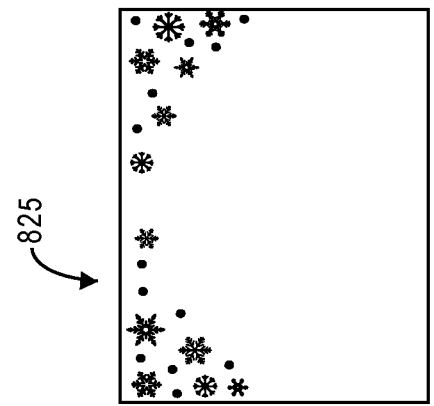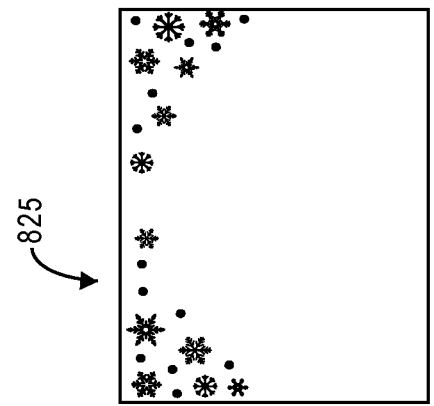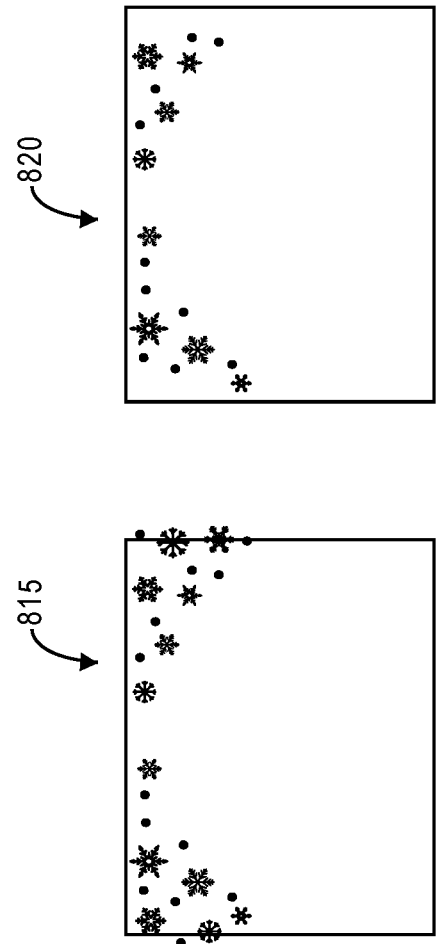
FIG. 8A
FIG. 8B
FIG. 8C
FIG. 8D
FIG. 8E

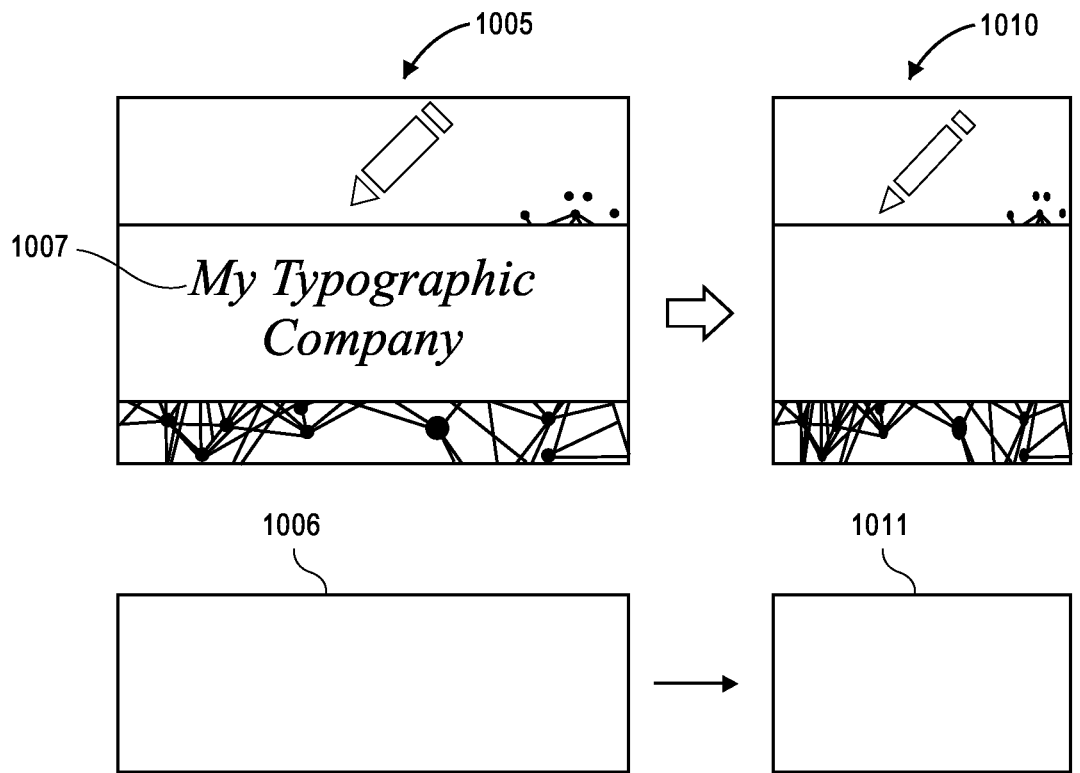
FIG. 10A
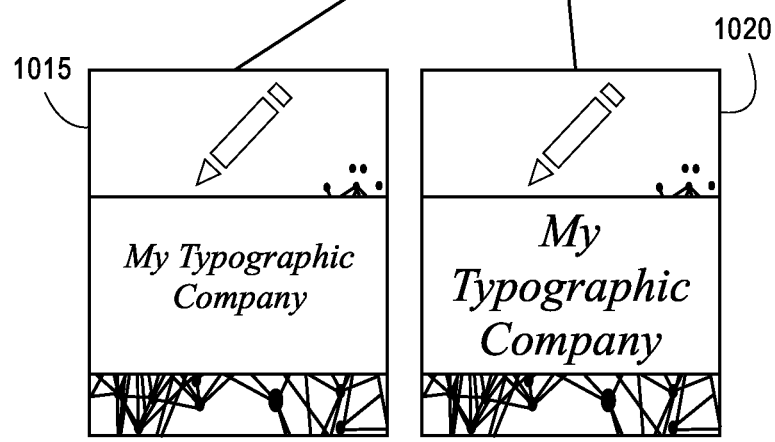
FIG. 10B  FIG. 10C

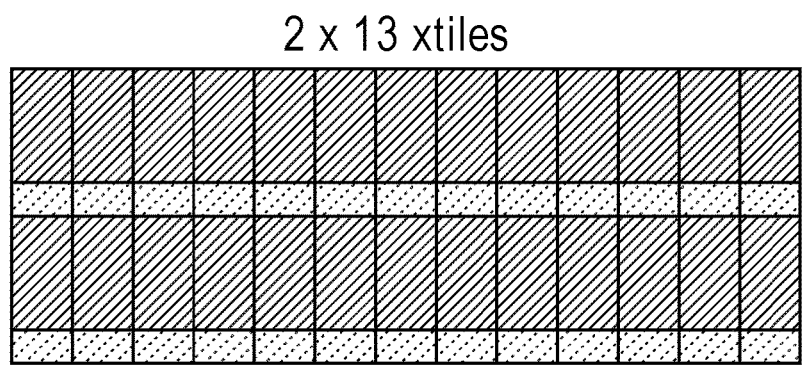
FIG. 10D
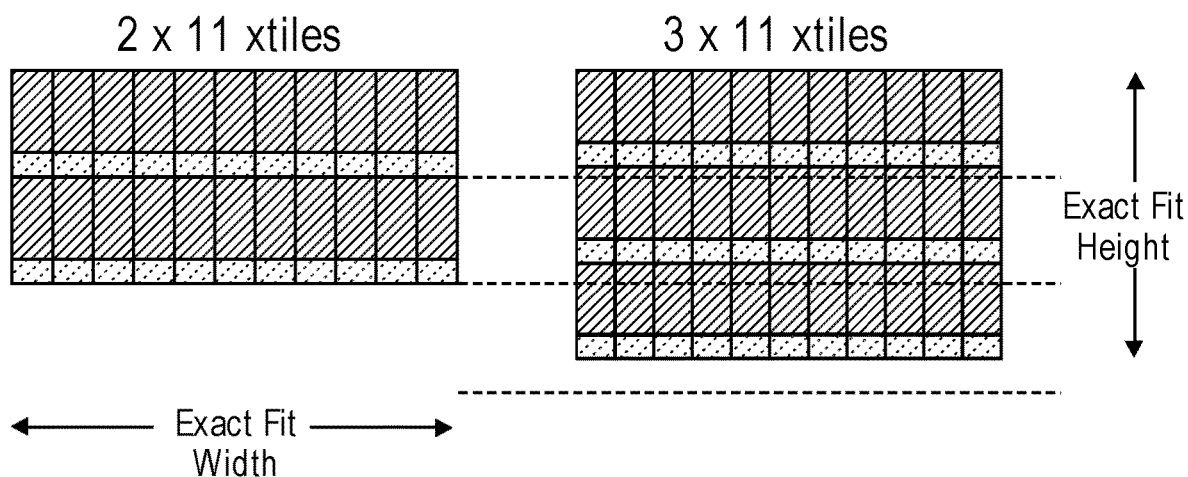
FIG. 10E  FIG. 10F

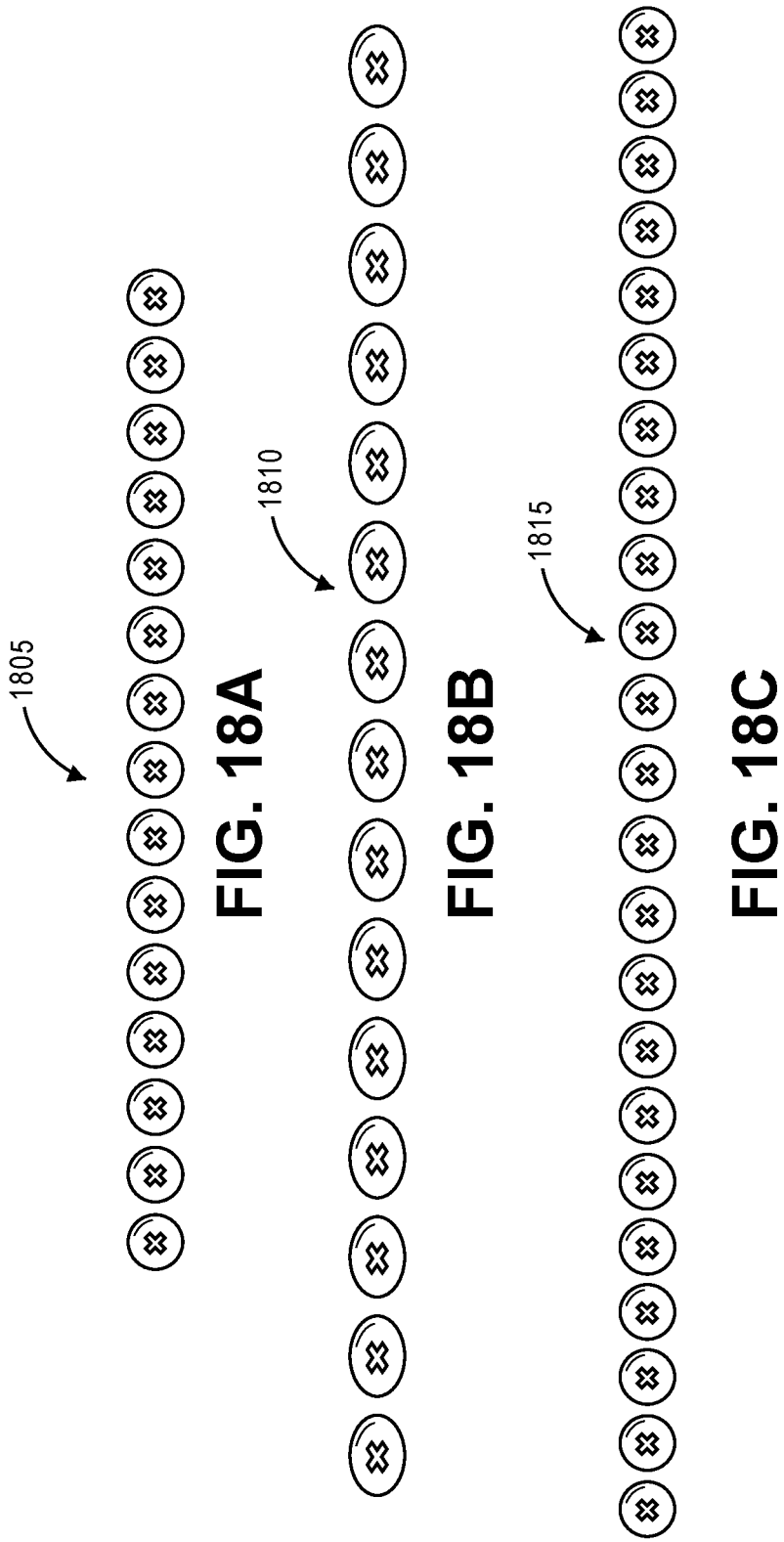

TECHNOLOGY FOR MANAGING GRAPHIC DESIGN USING METADATA RELATIONSHIPS

CROSS-REFERENCE TO RELATED APPLICATIONS

This application is a continuation of U.S. patent application Ser. No. 17/090,050, filed Nov. 5, 2020, which is a continuation of U.S. patent application Ser. No. 16/193,664, now U.S. Pat. No. 10,846,897, filed Nov. 16, 2018. These applications are hereby expressly incorporated by reference in their entireties.

FIELD

The present disclosure is directed to improvements that address limitations associated with design functionalities within a user interface of an electronic device. More particularly, the present disclosure is directed to platforms and technologies to effectively modify designs and elements thereof based on properties or characteristics of the design and the elements.

BACKGROUND

Individuals or customers frequently purchase or order products or items for certain applications or uses. For example, an individual may order customized printed products such as brochures and business cards associated with a business. Conventionally, individuals may use online design studios to customize the designs to be applied to certain products. These online design studios typically utilize predefined templates having certain design elements positioned at default locations in the templates.

However, products are often available in different shapes and sizes. For example, the aspect ratio of a business card (e.g., having a size of 2"×3.5") is different from that of a postcard (e.g., having a size of 4"×6"). Additionally, different users may want different sized products (e.g., note pads of differing sizes). Generally, different templates and elements are used for designs. However, when users use an online studio to design a custom product, the elements may not appear correct, especially when the design itself is modified (e.g., when the size of a business card template is modified). Additionally, designing or availing multiple templates to accommodate different design sizes is time consuming and inefficient.

Accordingly, there is an opportunity for platforms and techniques to effectively modify product designs and elements thereof so resulting product designs are still desired.

SUMMARY

In an embodiment, a computer-implemented method of modifying a visual design comprising at least a first design element is provided. The method may include: displaying, in a user interface, the visual design comprising at least the first design element in a first configuration and having associated a first container in which the first design element is contained, wherein the first design element has a first element behavior and the first container has a first container behavior; receiving, via the user interface, a selection to spatially adjust the first design element from the first configuration to a second configuration; determining, by a processor based on (i) the selection to spatially adjust the first design element, and (ii) at least one of the first element behavior of the first design element and the first container behavior of the first container, a modification to the first design element; and displaying, in the user interface, the first design element in the second configuration and reflecting the modification.

In another embodiment, an electronic device for modifying a visual design comprising at least a first design element is provided. The electronic device may include a user interface for displaying content, a memory storing non-transitory computer executable instructions, and a processor interfacing with the user interface and the memory. The processor may be configured to execute the non-transitory computer executable instructions to cause the processor to: cause the user interface to display the visual design comprising at least the first design element in a first configuration and having associated a first container in which the first design element is contained, wherein the first design element has a first element behavior and the first container has a first container behavior, receive, via the user interface, a selection to spatially adjust the first design element from the first configuration to a second configuration, determine, based on (i) the selection to spatially adjust the first design element, and (ii) at least one of the first element behavior of the first design element and the first container behavior of the first container, a modification to the first design element, and cause the user interface to display the first design element in the second configuration and reflecting the modification.

In another embodiment, a non-transitory computer-readable storage medium configured to store instructions is provided. The instructions when executed by a processor may cause the processor to perform operations comprising: displaying, in a user interface, the visual design comprising at least the first design element in a first configuration and having associated a first container in which the first design element is contained, wherein the first design element has a first element behavior and the first container has a first container behavior; receiving, via the user interface, a selection to spatially adjust the first design element from the first configuration to a second configuration; determining, based on (i) the selection to spatially adjust the first design element, and (ii) at least one of the first element behavior of the first design element and the first container behavior of the first container, a modification to the first design element; and displaying, in the user interface, the first design element in the second configuration and reflecting the modification.

BRIEF DESCRIPTION OF THE FIGURES

FIGS. 2A and 2B depict an example design and elements/components thereof, in accordance with some embodiments.

FIG. 5 depicts a modification to an example design and elements/components thereof, in accordance with some embodiments.

FIGS. 6A-6C depict a modification to an example design and elements/components thereof, in accordance with some embodiments.

FIGS. 8A-8E depict a modification to an example design and elements/components thereof, in accordance with some embodiments.

FIGS. 10A-10F depict a modification to an example design and elements/components thereof, in accordance with some embodiments.

FIGS. 18A-18C depict a design and modifications thereto, in accordance with some embodiments.

DETAILED DESCRIPTION

Figure 1A:
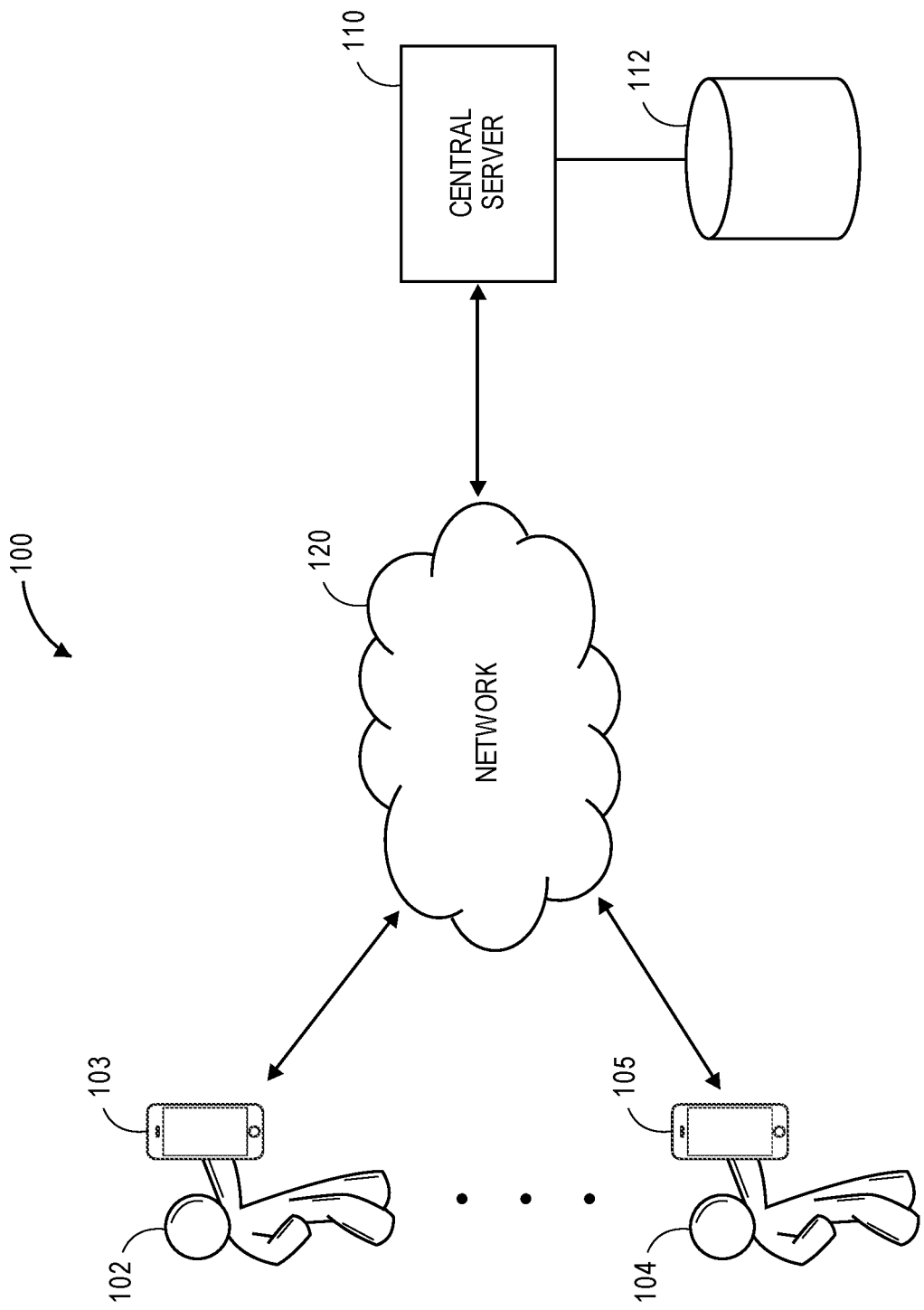
FIG. 1A depicts an overview of components and entities associated with the systems and methods, in accordance with some embodiments.

The present embodiments may relate to, inter alia, platforms and technologies for dynamically and effectively modifying product designs containing various graphical and/or textual content. According to certain aspects, an individual or customer may use an electronic device to customize, via a user interface, a design for a physical product in contemplation of ordering the physical product.

While customizing the design, the user may modify the design (e.g., the overall shape and/or size of the design) and/or certain elements of the design. In response to the user customizing the design, the electronic device may determine how the design itself and the certain elements of the design can be modified. In particular, the electronic device may access or identify certain properties or characteristics of the design elements that define how the design elements can be modified, and may determine modifications to the design elements based on the properties or characteristics. In this regard, the modified design and the modified design elements thereof may accurately reflect how the design and design elements are intended to look.

The systems and methods therefore offer numerous benefits. In particular, the effective design modification techniques result in design modifications that are desirable to customers. Accordingly, customers may experience greater flexibility and ease, and less frustration, in designing custom products. Additionally, fewer custom design templates are needed, as the existing custom design templates may be effectively modified to different shapes and sizes. These features generally enhance the product design itself and improve the individual's experience and satisfaction when ordering the physical item via the electronic device. Additionally, companies or entities that offer the physical items for sale may experience increased sales. It should be appreciated that additional benefits are envisioned.

The systems and methods discussed herein address a challenge that is particular to e-commerce. In particular, the challenge relates to a difficulty in accurately and effectively modifying digital designs of physical products. Conventionally, a user manually designs a product by manually manipulating elements of the design. Alternatively, the user must select a desired design from previously-designed templates. However, these conventional methods are often time consuming, ineffective, and/or expensive. The systems and methods offer improved capabilities to solve these problems by dynamically modifying designs and the elements thereof according to design modifications selected by users. Further, because the systems and methods employ communication between and among multiple devices, the systems and methods are necessarily rooted in computer technology in order to overcome the noted shortcomings that specifically arise in the realm of e-commerce.

The terms "components," "elements," and "design elements" may be used interchangeably throughout this description. Similarly, the terms "properties," "rules," and "characteristics" may be used interchangeably throughout this description.

FIG. 1A illustrates an overview of a system 100 of components configured to facilitate the systems and methods. It should be appreciated that the system 100 is merely an example and that alternative or additional components are envisioned.

As illustrated in FIG. 1A, the system 100 may include a set of users 102, 104 or individuals having or interacting with a respective set of electronic devices 103, 105. Each of the users 102, 104 may be any individual or person who may be interested in purchasing items, products, and/or services that may be offered for sale by an entity. In an embodiment, the entity may be a corporation, company, partnership, retailer, wholesaler operating on behalf of another entity (e.g., a white label wholesaler), or the like, where the entity may offer an e-commerce platform (e.g., a website accessible by or an application executable by the electronic devices 103, 105) and optionally a set of brick-and-mortar retail stores. Each of the electronic devices 103, 105 may be any type of electronic device such as a mobile device (e.g., a smartphone), desktop computer, notebook computer, tablet, phablet, GPS (Global Positioning System) or GPS-enabled device, smart watch, smart glasses, smart bracelet, wearable electronic, PDA (personal digital assistant), pager, computing device configured for wireless communication, and/or the like.

The electronic devices 103, 105 may communicate with a central server 110 via one or more networks 120. The central server 110 may be associated with the entity that owns and/or manages the e-commerce platform(s) and/or the set of brick-and-mortal retail stores. In particular, the central server 110 may include or support a web server configured to host a website that offers various products and/or services for purchase by users. Further, the central server 110 may support a software application executable by the set of electronic devices 103, 105 (i.e., the set of electronic devices 103, 105 may interface with the central server 110 in executing the software application). In embodiments, the network(s) 120 may support any type of data communication via any standard or technology (e.g., GSM, CDMA, TDMA, WCDMA, LTE, EDGE, OFDM, GPRS, EV-DO, UWB, Internet, IEEE 802 including Ethernet, WiMAX, Wi-Fi, Bluetooth, and others).

Although depicted as a single central server 110 in FIG. 1A, it should be appreciated that the server 110 may be in the form of a distributed cluster of computers, servers, machines, or the like. In this implementation, the entity may utilize the distributed server(s) 110 as part of an on-demand cloud computing platform. Accordingly, when the electronic devices 103, 105 interface with the server 110, the electronic devices 103, 105 may actually interface with one or more of a number of distributed computers, servers, machines, or the like, to facilitate the described functionalities.

The central server 110 may be configured to interface with or support a memory or storage 112 capable of storing various data, such as in one or more databases or other forms of storage. According to embodiments, the storage 112 may store data or information associated with products or services that are offered for sale by the entity that owns and/or manages the e-commerce platform and/or the set of brick-and-mortar retail stores. For example, the storage 112 may store information associated with office supplies such as business cards and notepads, including information associated with a customer or client (e.g., company name and logo). For further example, the storage 112 may store templates of designs, as well as information associated with the designs, including properties of the elements/components of the designs.

Although two (2) users 103, 105, two (2) electronic devices 103, 105, and one (1) server 110 are depicted in FIG. 1A, it should be appreciated that greater or fewer amounts are envisioned. For example, there may be multiple central servers, each one associated with a different entity. Additionally, the electronic devices 103, 105 and the central server 110 may interface with one or more separate, third-party servers (not depicted in FIG. 1A) to retrieve relevant data and information.

Figure 1B:
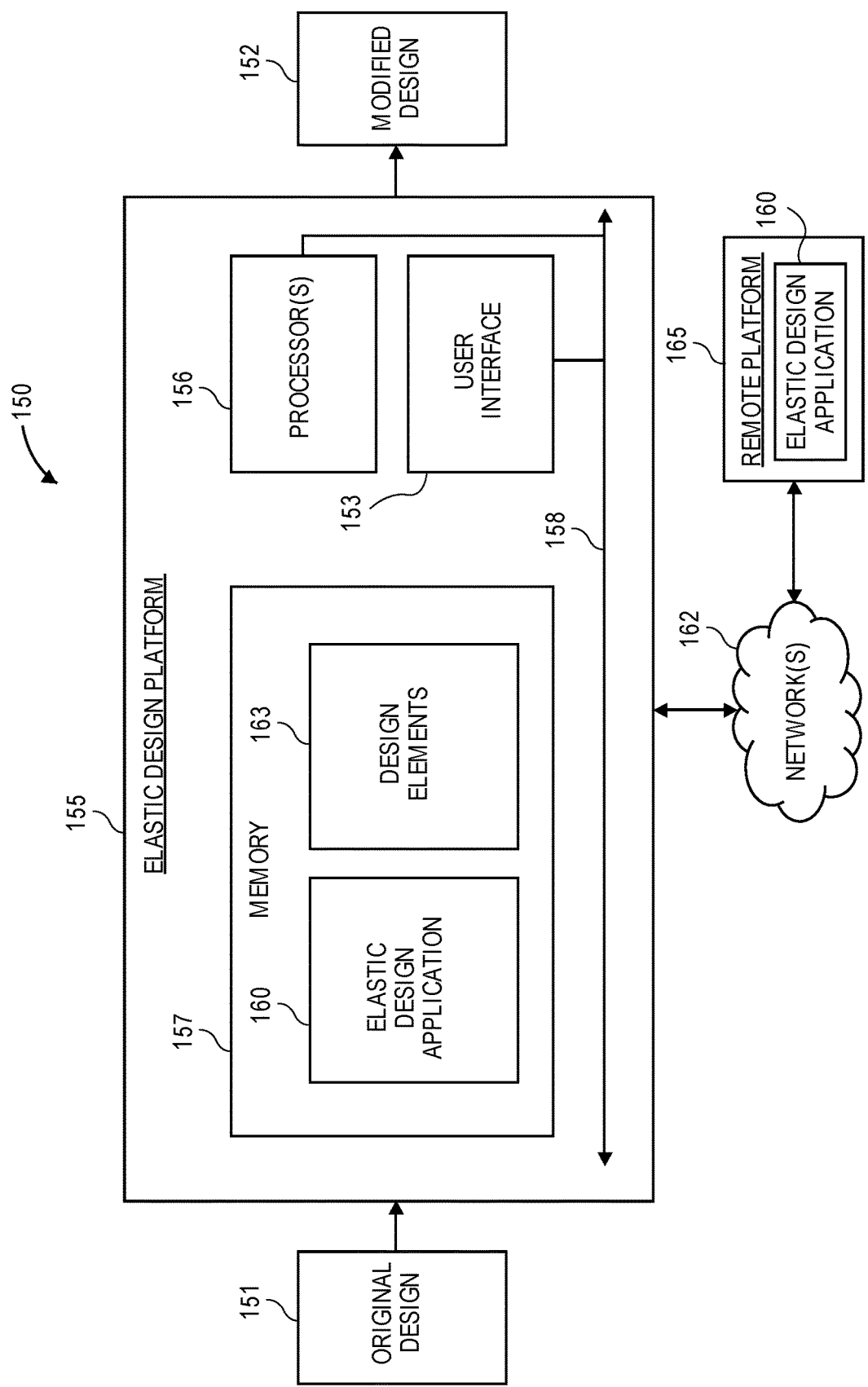
FIG. 1B depicts an overview of certain components configured to facilitate the systems and methods, in accordance with some embodiments.

According to embodiments, the users 102, 104 may select a design(s) of an item to preview and modify using the respective electronic devices 103, 105, such as in contemplation of placing an order for the item(s). The design(s) may include a set of design elements, each of which has a characteristic or property (e.g., as defined by metadata). The users 102, 104 may use the respective electronic devices 103, 105 to modify certain of the design elements. In response, the respective electronic devices 103, 105 (or in some cases, the central server 110) may determine, based on the respective characteristic(s) or property(ies), how to modify the selected design elements, as well as any additional design element(s) that may be affected by the modification of the selected design elements. Accordingly, the respective electronic devices 103, 105 may display the modified design for review by the users 102, 104. FIG. 1B depicts more specific components associated with the systems and methods.

FIG. 1B an example environment 150 in which an original design 151 is processed into a modified design 152 via an elastic design platform 155, according to embodiments. The elastic design platform 155 may be implemented on any computing device, including one or more of the electronic devices 103, 105 or the server 110 as discussed with respect to FIG. 1A. Components of the computing device may include, but are not limited to, a processing unit (e.g., processor(s) 156), a system memory (e.g., memory 157), and a system bus 158 that couples various system components including the memory 157 to the processor(s) 156. In some embodiments, the processor(s) 156 may include one or more parallel processing units capable of processing data in parallel with one another. The system bus 158 may be any of several types of bus structures including a memory bus or memory controller, a peripheral bus, or a local bus, and may use any suitable bus architecture. By way of example, and not limitation, such architectures include the Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus (also known as Mezzanine bus).

The elastic design platform 155 may further include a user interface 153 configured to present content (e.g., designs and components/elements thereof). Additionally, a user may make selections to the content via the user interface 153, such as to modify designs (or design elements thereof) presented thereon. The user interface 153 may be embodied as part of a touchscreen configured to sense touch interactions and gestures by the user. Although not shown, other system components communicatively coupled to the system bus 158 may include input devices such as cursor control device (e.g., a mouse, trackball, touch pad, etc.) and keyboard (not shown). A monitor or other type of display device may also be connected to the system bus 158 via an interface, such as a video interface. In addition to the monitor, computers may also include other peripheral output devices such as a printer, which may be connected through an output peripheral interface (not shown).

The memory 157 may include a variety of computer-readable media. Computer-readable media may be any available media that can be accessed by the computing device and may include both volatile and nonvolatile media, and both removable and non-removable media. By way of non-limiting example, computer-readable media may comprise computer storage media, which may include volatile and nonvolatile, removable and non-removable media implemented in any method or technology for storage of information such as computer-readable instructions, routines, applications (e.g., an elastic design application 160) data structures, program modules or other data. Computer storage media may include, but is not limited to, RAM, ROM, EEPROM, FLASH memory or other memory technology, CD-ROM, digital versatile disks (DVD) or other optical disk storage, magnetic cassettes, magnetic tape, magnetic disk storage or other magnetic storage devices, or any other medium which can be used to store the desired information and which can accessed by the processor 156 of the computing device.

The elastic design platform 155 may operate in a networked environment and communicate with one or more remote platforms, such as a remote platform 165, via a network 162, such as a local area network (LAN), a wide area network (WAN), or other suitable network. The platform 165 may be implemented on any computing device, including one or more of the electronic devices 103, 105 or the server 110 as discussed with respect to FIG. 1A, and may include many or all of the elements described above with respect to the platform 155. In some embodiments, as will be described herein, the elastic design application 160 as will be further described herein may be stored and executed by the remote platform 165 instead of by or in addition to the platform 155.

According to embodiments, the elastic design platform 155 (and more particularly, the elastic design application 160) may process or modify the original design 151 to produce the modified design 152. It should also be understood that although only one of each of the original design 151 and the modified design 152 is shown, the example environment 150 may be configured to process or modify multiple designs. Each of the original design 151 and the modified design 152 may be embodied as any type of electronic document, file, template, etc., that may include a set of design elements or components, each of which may be some type of displayable content (e.g., a combination of textual and/or visual content).

The memory 157 may further store design elements 163 accessible to the elastic design application 160. According to embodiments, the elastic design application 160 may process the original design 151 by modifying, deleting, inserting, and/or replacing certain of the set of design elements included in the original design 151. Each of the design elements included in the original design 151 and in the design elements 163 may have associated metadata that may define how the corresponding design element is to be presented within the original design 151 and/or modified based on a modification(s) to another design element(s).

A user may make certain modifications to the original design 151 (or to design element(s) thereof), and the elastic design application 160 may determine how any design element(s) should correspondingly modify according to the metadata of the design element(s). In embodiments, the designs 151, 152, the design elements, and the metadata thereof may be implemented using any type of file format. For example, the metadata may be in JavaScript Object Notation (JSON) format, or another format(s).

The elastic design application 160 may cause the design elements (and any modifications thereof) to be displayed on the user interface 153 for review by the user. The user may select to complete the modification of the original design 151, at which point the elastic design application 160 may output or otherwise avail the modified design 152 according to the modifications. In embodiments, the designs 151, 152 may be stored in memory as program data in a hard disk drive, magnetic disk and/or optical disk drive in the elastic design platform 155 and/or the remote platform 165. The design processing and modification techniques discussed herein are illustrated in certain of the following figures.

In embodiments, an individual such as a designer may use various components of the elastic design platform 155 to create or design a set of original designs (such as the original design 151). In particular, the individual may interface with the user interface 153 to make various selections to create an original design, such as choosing one or more of the design elements 163. An original design may serve as a design template that may be selected by a user (e.g., a customer) and modified into a customized design that suits a purpose of the user.

Additionally, an original design may be modified automatically by various components of the environment 150, or manually by the user. For example, an original design of a 2'×8' sign may be created. Subsequently, an entity may offer a new product, a 3'×10' sign, that did not exist when the original 2'×8' sign was created. Accordingly, the system may automatically resize the original design to meet the 3'×10' dimensions of the new product, and the elements of the original design may be modified accordingly. The automatic modification of the original design and elements thereof may be accomplished according to the techniques as discussed herein.

FIGS. 2A and 2B depict an example design and components thereof, as well as certain user interactions therewith. The design and components thereof may be presented on a user interface of a computing device, where a user of the computing device may interact with and make selections, via the user interface, in association with the design and components thereof. Accordingly, the user may select to manually adjust the overall aspect ratio of the design.

In particular, FIG. 2A depicts an example design 200 having a plurality of design elements. As depicted in FIG. 2A, the design 200 has a set of design elements 201, 202, 203, 204 that may respectively correspond to a set of images, where the set of design elements 201, 202, 203, 204 may be confined within a boundary represented by 209. As used herein, a boundary may be referred to as a "container" and may represent an area in which a design element is confined. Similarly, the design 200 has a set of design elements 205, 206, 207, 208, each of which may correspond to textual content or an image, and where the set of design elements 205, 206, 207, 208 may be confined within a boundary or container represented by 210.

According to embodiments, a container may have associated metadata that informs how a corresponding design element should "flow" or "reflow" into the container. For example, a user may label a design element as "fit" (i.e., the aspect ratio of the design element should not be violated); and in response, a computing device may append "aspect ratio locked (ARL)" metadata to a container corresponding to the design element. In operation, when the computing device detects that a design element is modified (e.g., spatially adjusted) by a user, the computing device may first resize the corresponding container according to the metadata of the container and based on the user selection, and then reflow the design element to fill the resized container.

According to embodiments, a user may make certain selections to modify the design 200. FIG. 2B depicts the effects to the various design elements of the design 200 in response to certain user selections (and accordingly, resizing of certain containers of the design 200). In particular, FIG. 2B depicts the modification to and effects on the design 220 across a first stage 211, a second stage 215, and a third stage 220.

The first stage 211 includes four (4) images of respective homes on the left side (defined by the boundary 209), and certain textual content and an additional image 212 on the right side (defined by the boundary 210). As depicted in the first stage 211, the dimensions of the additional image 212 do not match the boundary 210 of the right side. Accordingly, as depicted in the second stage 215, the boundary 210 (and accordingly the textual content and the additional image 212) may need to be extended to the left to accommodate the dimensions of the additional image 212.

While extending the boundary 210 (while still maintaining the dimensions of the overall design 200) results in the additional image 212 being accommodated, the boundary 209, and therefore the dimensions of the four (4) images on the left side, is condensed, as depicted in the third stage 220. Thus, the computing device may determine how to scale or modify the four (4) images on the left side to fit the modified boundary 209. As depicted in a fourth stage 225, the four (4) images may be modified by cropping, distorting, or the like. According to embodiments, the computing device may determine how to scale or modify the four (4) images according to a set of characteristics, properties, or rules, a set of metadata associated with the images (or generally, the design elements), and/or other data or information, as discussed herein.

Figure 3A:
FIGS. 3A-3C depict an example design and elements/components thereof, in accordance with some embodiments.
Figure 3B:
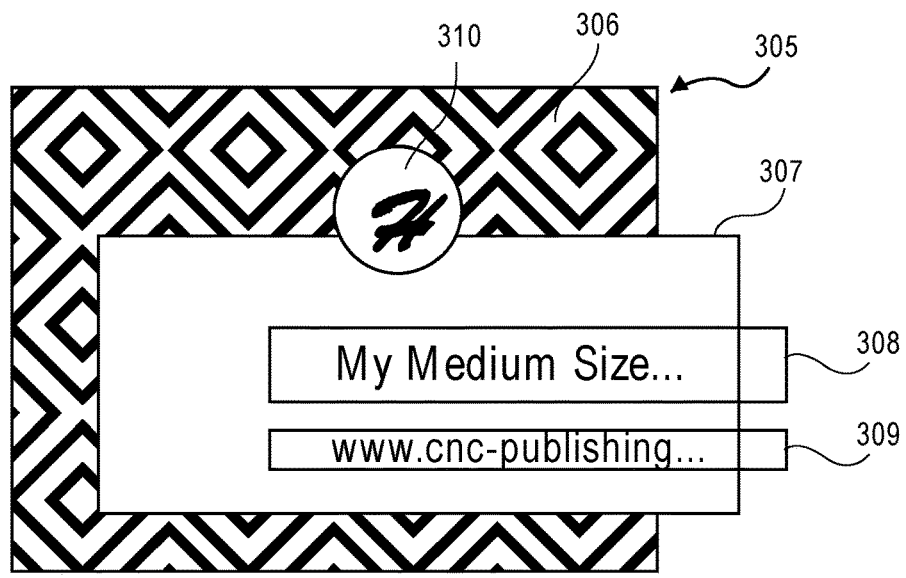
Figure 3C:
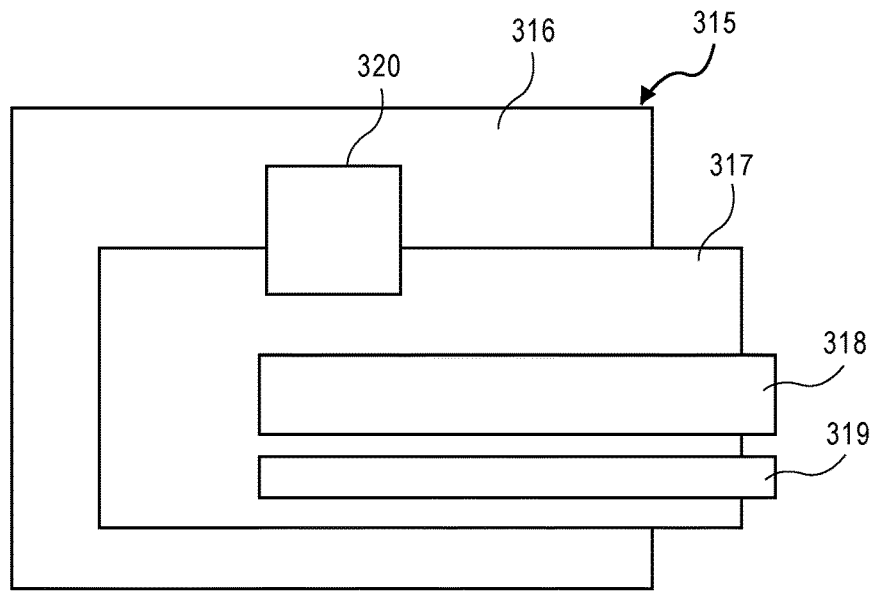

FIGS. 3A-3C depict example designs and components thereof. In particular, FIG. 3A depicts a first design 301 of an item and a second design 302 of the item. The first and second designs 301, 302 are generally the same design with the same or similar visual and textual content. However, the first design 301 has a longer width than that of the second design 302, the middle band of the first design 301 is shorter than that of the second design 302, and the pattern on the outer bands of the first design 301 is less compact that that of the second design 302.

FIG. 3B depicts a design 305 similar to the designs 301, 302, and design elements thereof. In particular, the design 305 has a background pattern element 306, a center band element 307, a first textual element 308, a second textual element 309, and a logo element 310.

FIG. 3C depicts a design 315 corresponding to the design 305 of FIG. 3B, and depictions of design elements corresponding to the design elements of FIG. 3B. In particular, the design elements of FIG. 3C are depicted as blank containers or boundaries. In particular, the design 315 has a background pattern container 316 that may confine the background pattern element 306, a center band container 317 that may confine the center band element 307, a first textual container 318 that may confine the first textual element 308, a second textual container 319 that may confine the second textual element 309, and a logo container 320 that may confine the logo element 310. In embodiments, there may be a hierarchical (i.e., parent/child) relationship between and among containers. For example, the background pattern container 316 may be the "parent" container to the center band container 317, the first textual container 318, the second textual container 319, and the logo container 320.

According to embodiments, each of the containers (and/or the design elements) may have associated a rule(s) or metadata that defines the behavior or modification of the container (or design element) in response to a modification to the container (or design element) or another container (or another design element). As used herein, the rule(s) or metadata that defines the behavior of a container may be referred to as a "container behavior" and the rule(s) or metadata that defines the behavior of a design element may be referred to as an "element behavior."

In an embodiment, in response to a design element spatially adjusting (i.e., resizing or repositioning), a computing device may determine how the corresponding container should adjust based on the container behavior of that container. For example, the metadata may define that the container should scale proportionally to its parent container, that the container should resist deforming, that the container should preserve its aspect ratio, that the container should "greedily" consume space around it in one or more directions, and/or other behaviors.

Similarly, the manner in which a design element modifies to fit the determined adjusted container may be defined by the element behavior of the design element. For example, if the design element is an image, the element behavior may define that the image should crop (or stretch, or fit as best possible) to fit the determined adjusted container. Accordingly, the manner in which a design element adjusts or modifies may be defined by the container behavior of the corresponding container, the element behavior of the design element, or a combination of the container behavior and the element behavior.

Generally, a computing device on which designs are displayed (or remote from another device that displays the designs) may determine how to modify the designs and the containers (or design elements) thereof, based on modifications to any of the containers (or design elements) as well as on any metadata applicable to the container(s) and/or design element(s).

Figure 4B:
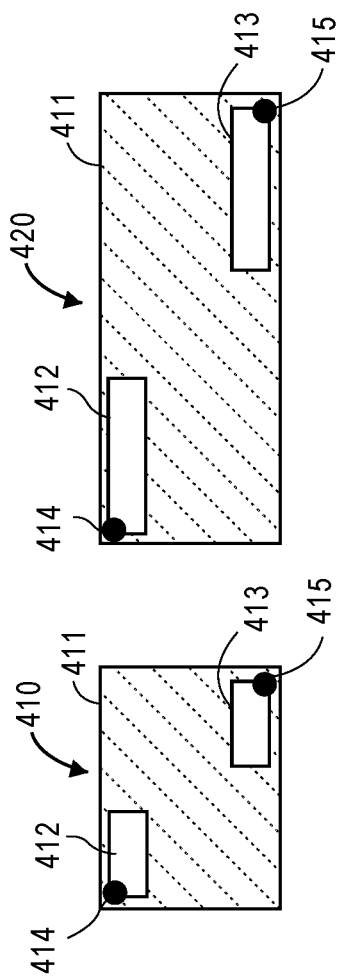
FIGS. 4A-4C depict an example design and elements/components thereof, in accordance with some embodiments.
Figure 4C:
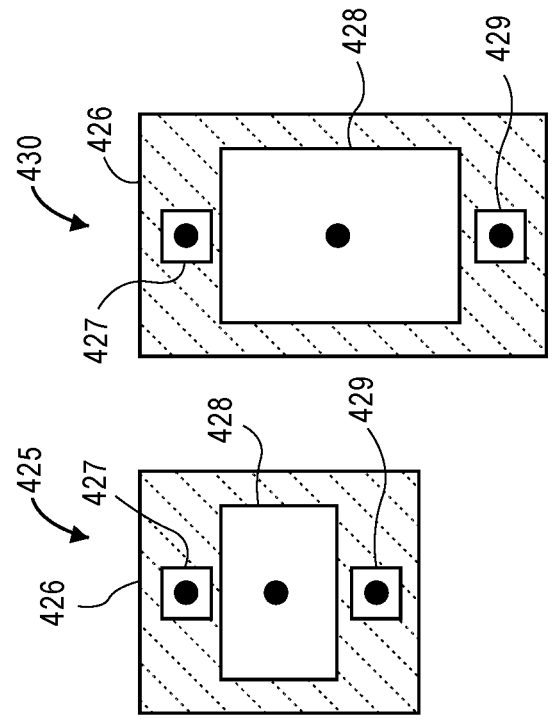
Figure 4A:
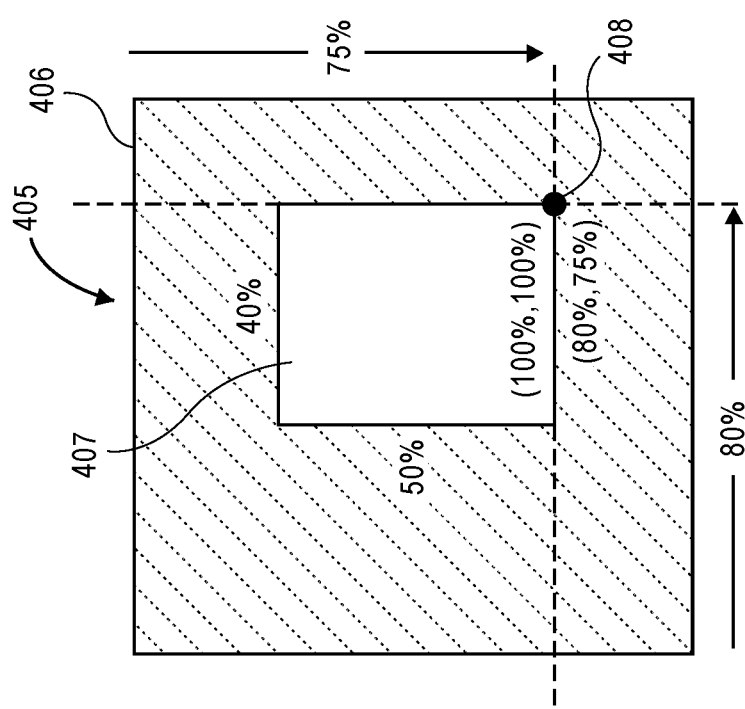

FIG. 4A depicts a design 405 and design elements thereof. In particular, the design 405 may include a boundary element 406 and an interior element 407. As depicted in FIG. 4A, the interior element 407 is "registered" with the boundary element 406, as represented by 408, at a position corresponding to 80% of the width and 75% of the height of the boundary element 406. Because the interior element 407 is registered with the boundary element 406, the interior element 407 will maintain its position relative to the boundary element 406 at 408 in response to a modification of either or both of the interior element 407 and the boundary element 406 (i.e., the lower right corner of the interior element 407 will maintain its position corresponding to 80% of the width and 75% of the height of the boundary element 406).

FIG. 4B depicts a modification to a design, and the corresponding effects on the design elements of the design. In particular, a first instance 410 of the design is depicted on the left side of FIG. 4B, where the design includes a boundary element 411, a first interior element 412 registered with the boundary element 411 at 414, and a second interior element 413 registered with the boundary element 411 at 415.

A user may select to widen the design (i.e., widen the boundary element 411), as depicted in a second instance 420 of the design on the right side of FIG. 4B. When the boundary element 411 is widened, each of the interior elements 412, 413 also widens accordingly. However, in response to the modification to the boundary element 411, the first interior element 412 remains registered with the boundary element 411 at 414, and the second interior element 413 remains registered with the boundary element 411 at 415, and thus the first and second interior elements 413 remain at the same positions (i.e., at 414 and 415) relative to the boundary element 411.

FIG. 4C also depicts a modification to a design, and the corresponding effects on the design elements of the design. In particular, a first instance 425 of the design is depicted on the left side of FIG. 4C, where the design includes a boundary element 426, a first interior element 427 registered with the boundary element 426 at a center of the first interior element 427, a second interior element 428 registered with the boundary element 426 at a center of the second interior element 428, and a third interior element 429 registered with the boundary element 426 at a center of the third interior element 429.

According to embodiments, each of the interior elements 427, 428, 429 may have a property or characteristic that defines the behavior or modification of the respective element 427, 428, 429 in response to a modification to another element (e.g., the boundary element 426). For purposes of explanation, it may be assumed that each of the interior elements 427 and 429 may have an "aspect ratio (AR) lock" property whereby the AR of each of the interior elements 427 and 429 is preserved or locked in response to a modification; and that the interior element 428 has a "greedy" property whereby the interior element 428 may fill in or occupy space that is created in response to a modification.

It should be appreciated that additional or alternative properties are envisioned. For example, an element(s) along a border of an exterior element (i.e., the "frame") may have a "picture framing" property whereby the corresponding element(s) may preserve its aspect ratio as the exterior element modifies is shape and/or size.

A user may select to increase the length of the design (i.e., increase the length of the boundary element 426), as depicted in a second instance 430 of the design on the right side of FIG. 4C. When the boundary element 426 is lengthened, the interior elements 427, 428, 429 may adjust (or not adjust) accordingly based on their respective properties. In particular, because the interior elements 427, 429 have an "AR lock" property (i.e., maintain a square shape) and because only the length of the boundary element 426 is being adjusted, the interior elements 427, 429 do not adjust from the first instance 425 to the second instance 430. Further, because the interior element 428 has a "greedy" property, the interior element 428 fills in the space created by the lengthening of the boundary element 426 and the interior elements 427, 429 remaining the same, from the first instance 425 to the second instance 430.

FIG. 5 depicts an additional modification to a design, and the corresponding effects on the design elements of the design. In particular, the design is of a conference room table with a number of chairs positioned at the conference room table.

FIG. 5 depicts a first instance 505 of the design being modified to a second instance 510 of the design. The first instance 505 of the design depicts the conference room table with ten (10) chairs. Generally, when the size of the conference room table is modified, the size of the chairs should not be modified because the chairs have a fixed sized, which may be reflected in a property associated with a design element corresponding to a chair. Instead, the number of chairs should increase or decrease (or, in some cases, stay the same) based on the size modification to the conference room table.

The second instance 510 of the design depicts the conference room table smaller than that in the first instance 510. Accordingly, the number of chairs decreases from ten (10) to eight (8) such that the eight (8) remaining chairs properly fit the new size of the conference room table.

FIGS. 6A-6C depict a modification to a design of an exemplary business card, and the corresponding modifications to elements or components thereof.

FIG. 6A depicts a first instance 605 of the design and elements thereof, including a circle element 606, a first pattern element 607, and a second pattern element 608. A user may make adjustments to one or more of the elements (or a corresponding container(s)), which may affect how the other elements are modified. For purposes of explanation, it may be assumed that the user shortens the length of the design (the x-direction as depicted in FIG. 6A) and lengthens the height of the design (the y-direction as depicted in FIG. 6A).

FIG. 6B depicts a second instance 610 of the design after modification, along with elements thereof and how they are modified. When the design is modified (i.e., by shortening the length and lengthening the height), an underlying computing device may determine how to modify the elements based on respective properties or characteristics of the elements and/or container(s). The circle element 606 may have a fit characteristic specifying that the circle element 606 should fit within a defined space or element. As depicted in FIG. 6B, upon modification of the design, the circle element 606 maintains its fit within a defined space 611 within the design (i.e., the circle element 606 generally maintains its shape within the defined space 611).

Additionally, the first pattern element 607 may have a stretch characteristic specifying that the first pattern element 607 should stretch to fit a defined space or element. As depicted in FIG. 6B, upon modification of the design, the first pattern element 607 stretches to fit within the defined space within the design (i.e., the number of dots in the first pattern element 607 remains the same but there may be more or less space between the dots).

Further, the second pattern element 608 may have a fill characteristic specifying that the second pattern element 608 should fill to fit a defined space or element. According to embodiments, the fill characteristic differs from the stretch characteristic in that an element with the fill characteristic will replicate its underlying pattern when expanding to an additional defined space (or crop its underlying pattern when the defined space is reduced), and an element with the stretch characteristic will expand (or stretch) to fill additionally-defined space (or shrink when the defined space is reduced). As depicted in FIG. 6B, upon modification of the design, the second pattern element 608 is cropped to fit the defined space within the design (in this case, the entire design). FIG. 6C depicts a third instance 615 of the design after the modification.

Figure 7:
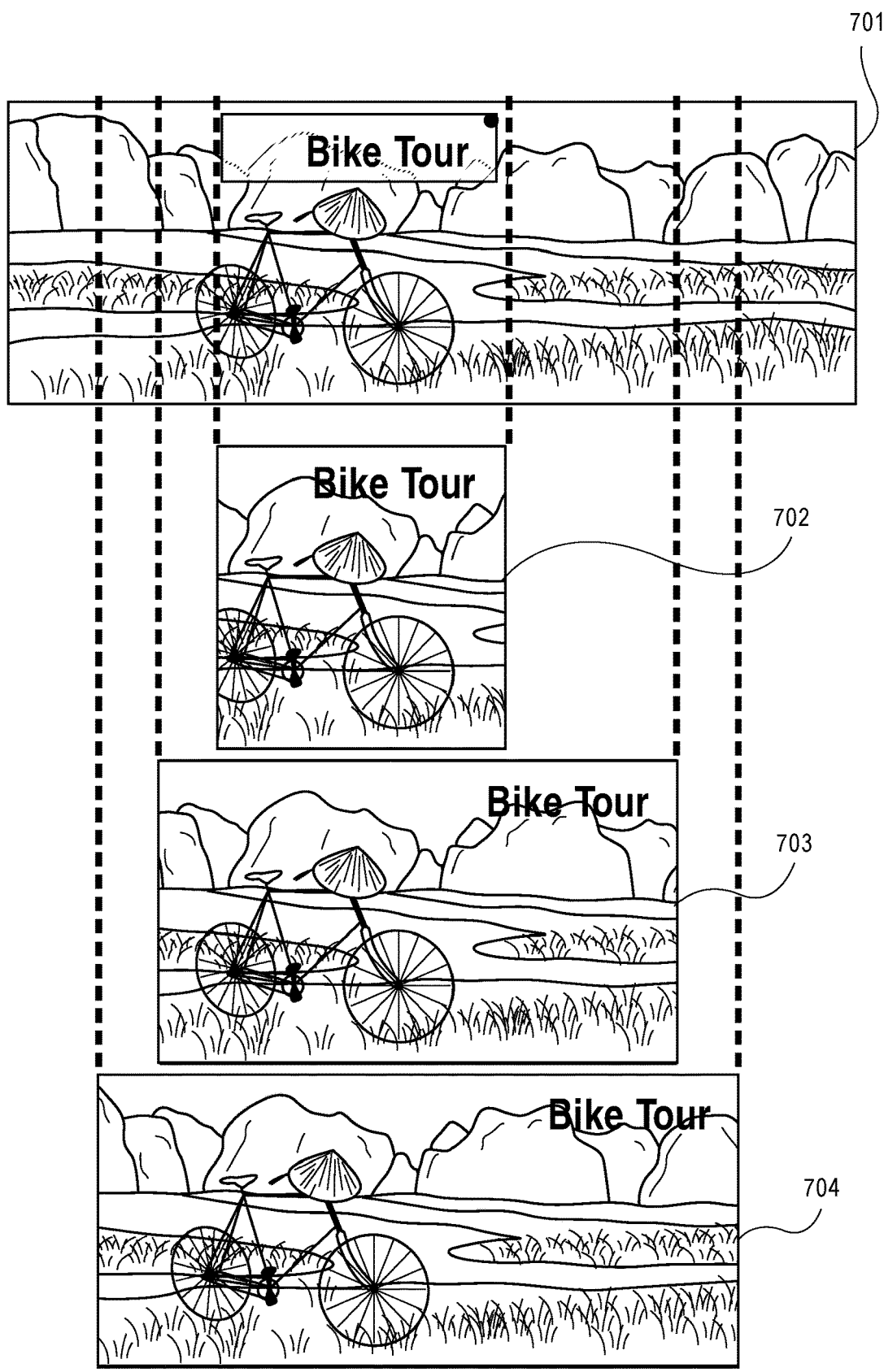
FIG. 7 depicts a modification to an example design and elements/components thereof, in accordance with some embodiments.

FIG. 7 depicts various versions of an image with varying amounts of cropping. In particular, a first version 701 of the image may be a master image (i.e., an image that is not cropped), and a second version 702, a third version 703, and a fourth version 704 may be versions of the image with varying degrees of cropping.

Generally, the image may be an element included in a design, and the image may modify in response to a modification of another element (or container) of the design. In embodiments, the image may have a property or characteristic specifying that the image should be cropped in association with a modification, where a computing device may determine how the image should be modified (i.e., cropped).

As depicted in FIG. 7, the computing device may determine which elements from the image should remain in the cropped image. For example, in each of the versions 701, 702, 703 of the image, the bike along with the text "Bike Tour" may remain. Generally, in determining how to modify the image, the computing device may selectively crop the master image 701 without any distortion, stretching, and/or the like.

FIGS. 8A-8E depict a modification to an exemplary design having certain design elements (as shown: a set of snowflakes). FIG. 8A depicts an initial instance 805 of the design and FIG. 8B depicts a modified instance 810 of the design. According to embodiments, the computing device may determine how to modify the snowflakes in response to the design being narrowed as shown in the modified instance 810. In particular, the computing device may examine element behavior corresponding to one or more of the snowflakes to determine how to modify the snowflakes(s) in response to an adjustment to the corresponding container.

FIG. 8C depicts a first version 815 of the modified design. In particular, the first version 815 depicts the snowflakes located on the edges of the modified design being clipped, leaving partial snowflakes. FIG. 8D depicts a second version 820 of the modified design. In particular, the second version 820 depicts an "all or none" modification which removes the snowflakes located on the edges of the modified design. FIG. 8E depicts a third version 825 of the modified design. In particular, the third version 825 depicts a "nudge to fit" modification which moves the snowflakes located on the edges of the modified design to fit within the modified design.

Figure 9A:
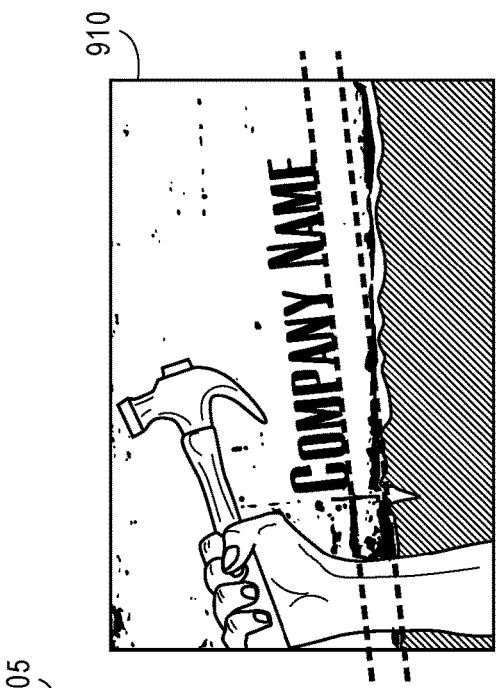
FIGS. 9A-9C depict a modification to an example design and elements/components thereof, in accordance with some embodiments.
Figure 9B:
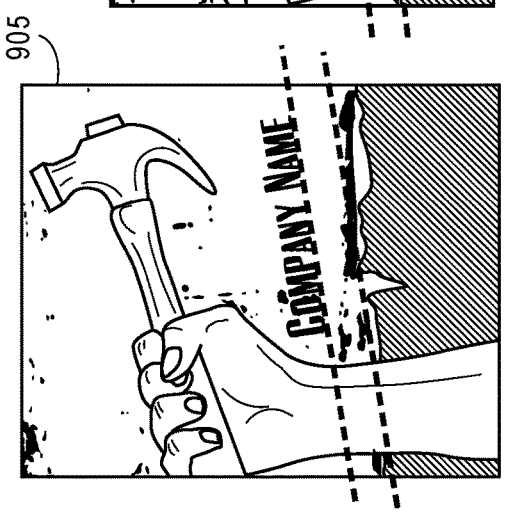
Figure 9C:
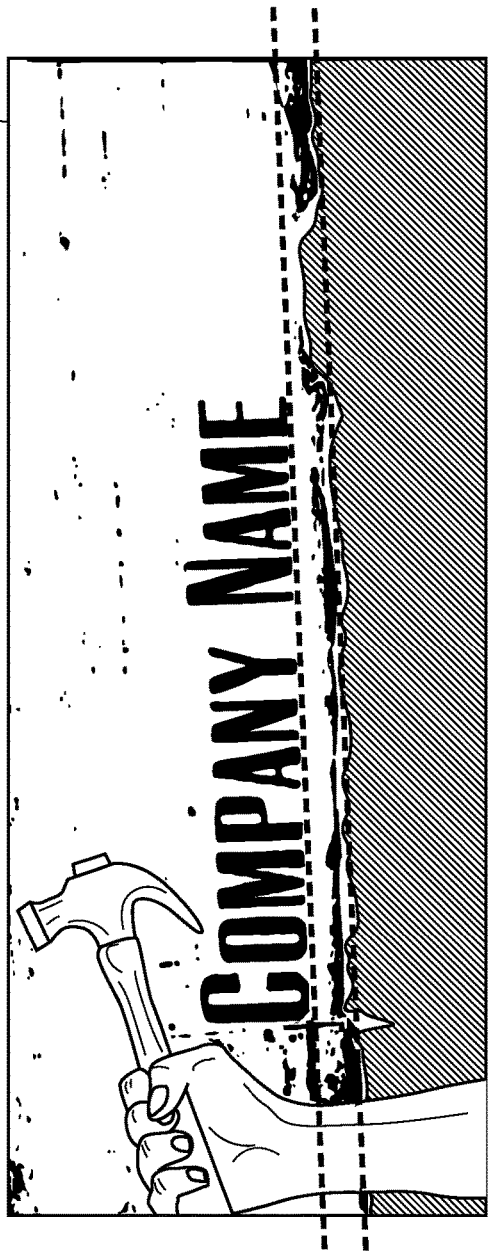

FIGS. 9A-9C depict a modification to an exemplary design according to different aspect ratios of the design. In particular, FIG. 9A depicts a first instance 905 of the design having a first aspect ratio, FIG. 9B depicts a second instance 910 of the design having a second aspect ratio, and FIG. 9C depicts a third instance 915 of the design having a third aspect ratio. Each of the instances 905, 910, 915 of the design includes textual content (as shown: "COMPANY NAME") and a graphic (as shown: a hand holding a hammer).

In each instance 905, 910, 915 of the design, the textual content is angled slightly upward, where the degree of the angle may depend on the aspect ratio of the respective instance 905, 910, 915 (i.e., the respective container). In particular, the first instance 905 is in a portrait layout with the textual content having an angle that is greater than the angle in each of the second instance 910 and the third instance 915 (which are in different degrees of landscape layout). According to embodiments, the textual content may have an associated property or characteristic that defines how its angle can be modified in response to a modified aspect ratio of the container. Further, a user may select to modify the aspect ratio of the design, and a computing device may determine, based on the associated property or characteristic, how to modify the angle of the textual content based on the modified aspect ratio.

FIGS. 10A-10C depict a modification to an exemplary design having textual content. FIG. 10A depicts a first instance 1005 of the design and a second instance 1010 (i.e., a modified instance) of the design. The first instance 1005 of the design includes textual content 1007 confined within an element 1006 of the design. When the design modifies from the first instance 1005 to the second instance 1010, the computing device may determine how to fit the textual content 1007 within a modified element 1011 of the design.

FIG. 10B depicts a first modified version 1015 of the design and FIG. 10C depicts a second modified version 1020 of the design, based on the second instance 1010 of the design. In some situations, the first modified version 1015 may be undesirable because the textual content (which occupies two lines of text like the original textual content 1007) is too small for the modified element 1011. Conversely, the second modified version 1020 may be desirable because the textual content (which occupies three lines of text) is appropriately sized for the modified element 1011.

The computing device may determine how to fit or modify the textual content based a mechanism referred to as "payload preservation," or generally the size of the font/text needed to preserve the potential payload of the textual content. The computing device may initially determine how many characters are included in the textual content. For example, "My Typographic Company" has twenty-two (22) characters including spaces.

FIG. 10D depicts the modified element 1011 at least partially segmented into two rows of thirteen (13) spaces/tiles (or twenty-six (26) total spaces/tiles), FIG. 10E depicts the modified element 1011 at least partially segmented into two rows of eleven (11) spaces/tiles (or twenty-two (22) total spaces/tiles), and FIG. 10F depicts the modified element 1011 at least partially segmented into three rows of eleven (11) spaces/tiles (or thirty-three (33) total spaces/tiles).

The first modified version 1015 may be generated based on the segmentation depicted in FIG. 10D. Because the characters of the textual content 1007 is confined to two (2) rows, the characters appear smaller and may therefore be undesirable. In contrast, the second modified version 1015 may be generated based on the segmentation depicted in FIG. 10F, in which the characters of the textual content 1007 is confined to three (3) rows, thereby enabling the characters to consume more vertical space of the modified element 1011 and enabling the characters to be larger, which may be more desirable. The computing device may determine the optimal change in font size of the textual content 1007 based on the number of spaces/tiles per row, and amount of rows that can fit in the modified element 1011.

Figure 11:
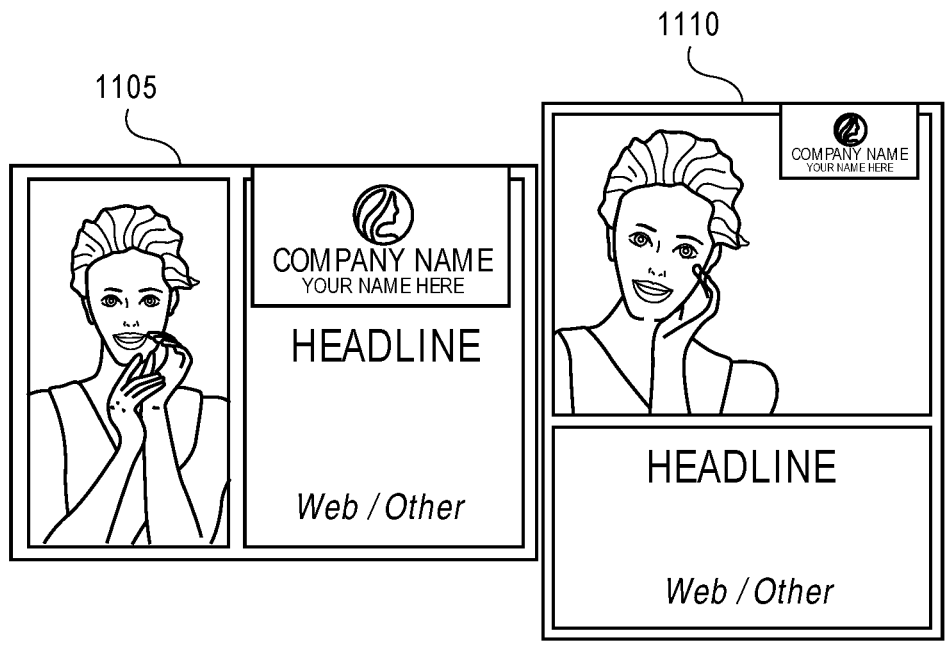
FIGS. 11 and 12 depict different variations of designs, in accordance with some embodiments.
Figure 12:
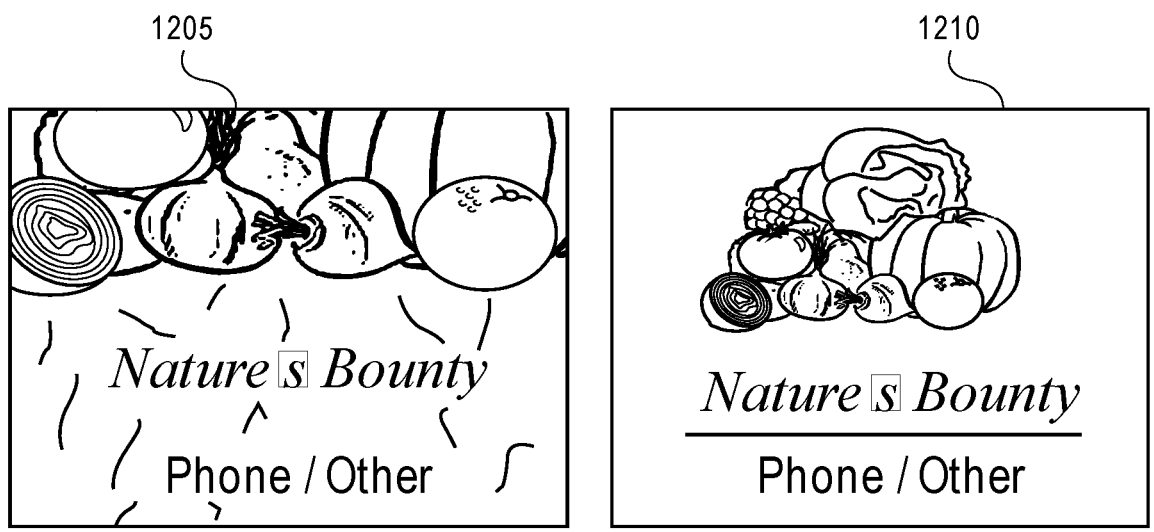

According to embodiments, the computing device may also be configured to initially select a specific design variation for a product from a set of different design variations. FIGS. 11 and 12 each depict different variations of a design, where the design variations vary slightly. In particular, FIG. 11 depicts a first variation 1105 and a second variation 1110 of the design. The variations vary slightly, in particular the images are different and the company logos are different sizes. Similarly, FIG. 12 depicts a first variation 1205 and a second variation 1210 of a design. The variations vary slightly, in particular the first variation 1205 is opaque and includes a cropped image, and the second variation 1210 is transparent (and thus a viewer may not perceive a product boundary relative to a window that the product is adhered to) and includes a whole image.

Figure 13:
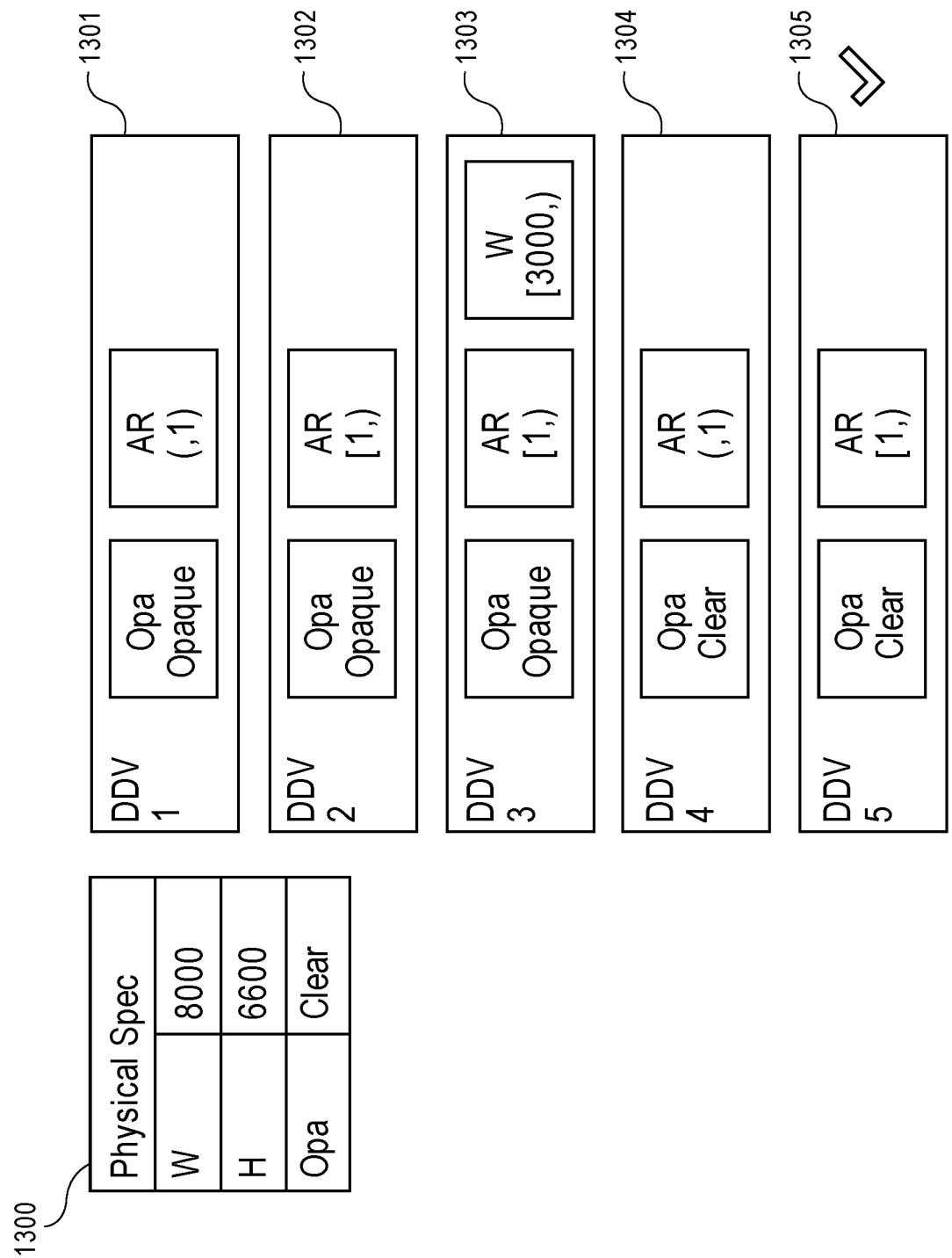
FIG. 13 depicts information associated with selecting a variation for a design, in accordance with some embodiments.

FIG. 13 depicts information representing desired specifications 1300 for a design as well as different variations of the design (1301-1305). The desired specifications 1300 indicate a width of 8000 pixels, a height of 6600 pixels, and a clear opacity. The different variations of the design 1301-1305 each include a set of filters or criteria, each of which may correspond to a physical property of the corresponding design variation. For example, the variation 1301 is for an opaque design with an aspect ratio between 0 and 1, exclusive; for further example, the variation 1303 is for an opaque design with an aspect ratio greater than or equal to 1, and a width greater than or equal to 3000 pixels. According to embodiments, the set of filters or criteria may include size, height, width, aspect ratio, opacity, shape of product, substrate color, decoration technology, and/or others.

The computing device may select a variation of the design based on the desired specifications 1300 and the set of filters or criteria of the designs themselves. As depicted in FIG. 13, the variation 1305 has a set of filters or criteria (in particular, a clear design with an aspect ratio greater than or equal to 1) that matches the desired specifications 1300, and thus the computing device may select the variation 1305 for any potential modification.

Figure 14:
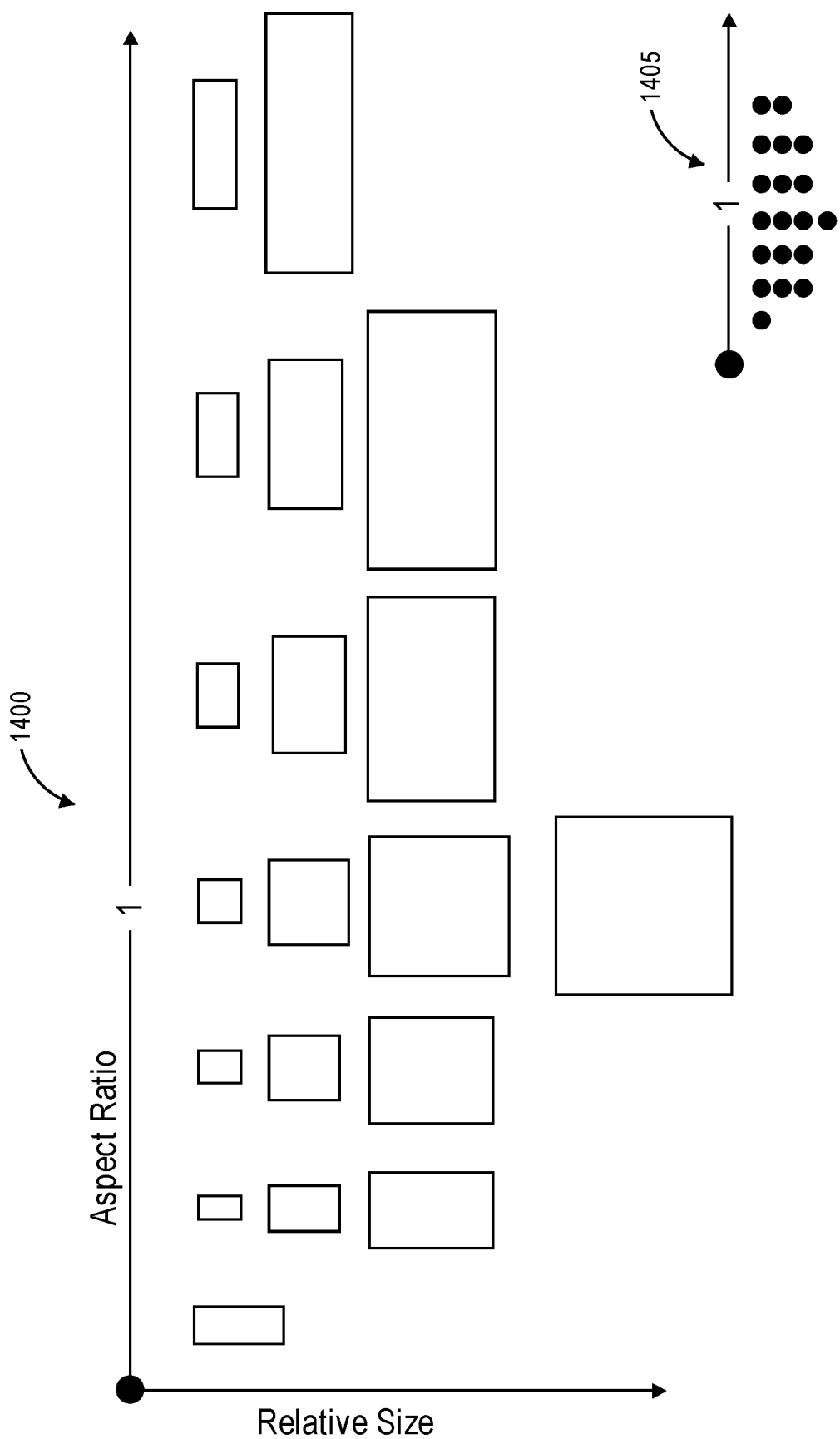
FIGS. 14 and 15 depict charts of various designs having various aspect ratios, in accordance with some embodiments.

FIG. 14 depicts a chart 1400 that includes a plurality of shape variations having different sizes and aspect ratios. Along the "Aspect Ratio" axis of the chart 1400, the shape variations progress from an aspect ratio of less than 1, to 1 (i.e., square), to greater than one. Along the "Relative Size" axis of the chart 1400, the shape variations increase in size. For purposes of explanation, another version 1405 of the chart is depicted in FIG. 14, with dots replacing the distinctive shape variations.

Figure 15:
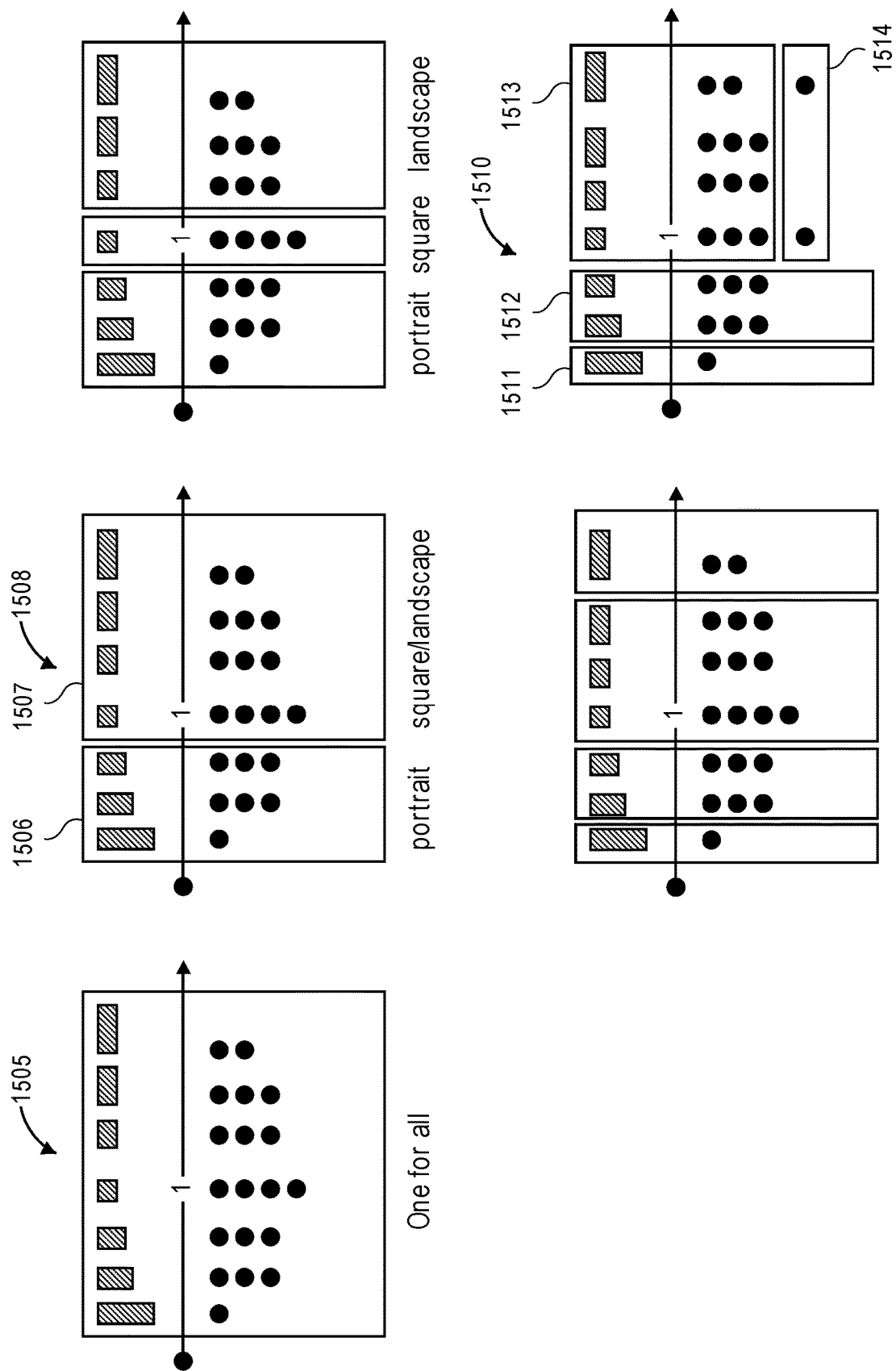

FIG. 15 depicts a set of charts indicative of various designs and variations thereof, using the notation of the chart 1405 as depicted in FIG. 14. Each chart of FIG. 15 may represent a design, and each shaded box may represent an aspect ratio for the corresponding design. Each outlined (i.e., non-shaded) box may "cover" one or more dots, each of which represents a certain aspect ratio of a certain size, where each outlined box may correspond to a design variation. Thus, when a desired aspect ratio and a desired size is selected or determined, the proper design variation may be selected based on the corresponding outlined box.

As depicted in FIG. 15, a design 1505 may be deemed as "one for all" when a singular variation is applicable to all aspect ratios of all sizes. In contrast, a design 1508 may have a first variation 1506 for all aspect ratios less than one (i.e., portrait), and a second variation 1507 for all aspect ratios greater than or equal to one (i.e., square and landscape). In another example, a design 1510 may have different variations 1511, 1512, 1513, 1514 that align with different combinations of aspect ratios as sizes, as depicted in FIG. 15.

Figure 16:
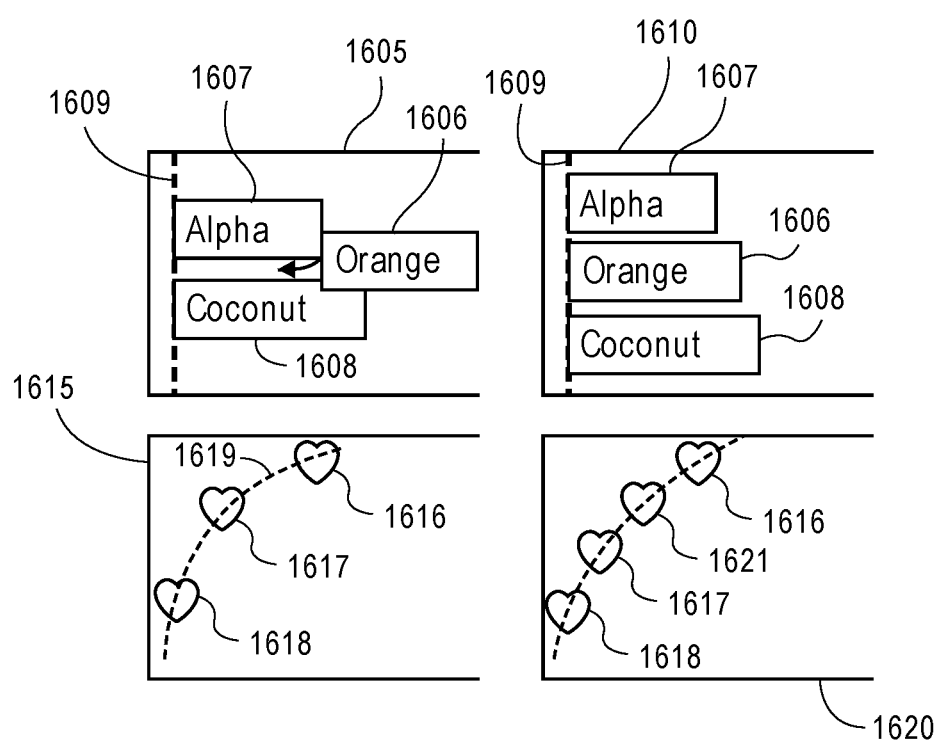
FIG. 16 depicts the insertion of various elements/components associated with various designs, in accordance with some embodiments.

FIG. 16 depicts various designs and elements thereof, as well as behaviors exhibited by the elements when a new element is added to the design. In particular, a first instance 1605 of a design is shown with an element 1606 attempting to be added thereto. The first instance 1605 includes additional elements 1607, 1608 that are already "anchored" to a rail element 1609. A second instance 1610 of the design is shown with the element 1608 also being anchored to the rail element 1609. In particular, upon the computing device detecting that the element 1606 is to be added, the computing device may automatically anchor the element 1606 to the rail 1609, and adjust the positions of the additional elements 1607, 1608.

FIG. 16 also depicts a first instance 1615 of another design, in which a set of elements 1616, 1617, 1618 are anchored to a rail 1619. A second instance 1620 of the design in which an additional element 1621 is added. Upon the computing device detecting that the element 1621 is to be added, the computing device may automatically anchor the element 1621 to the rail 1619, and adjust the positions of the set of elements 1616, 1617, 1618.

Figure 17A:
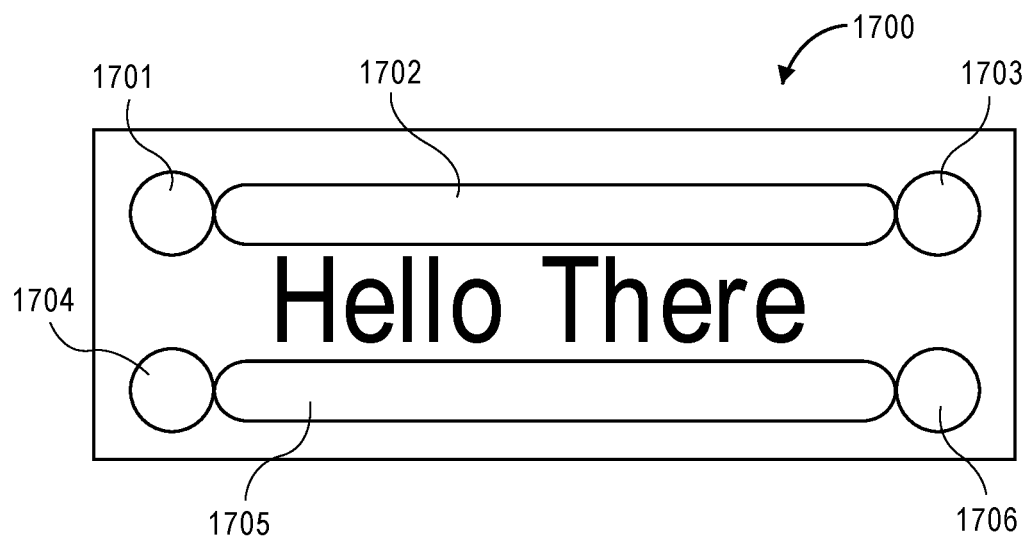
FIGS. 17A and 17B depict a design and modifications thereto, in accordance with some embodiments.
Figure 17B:
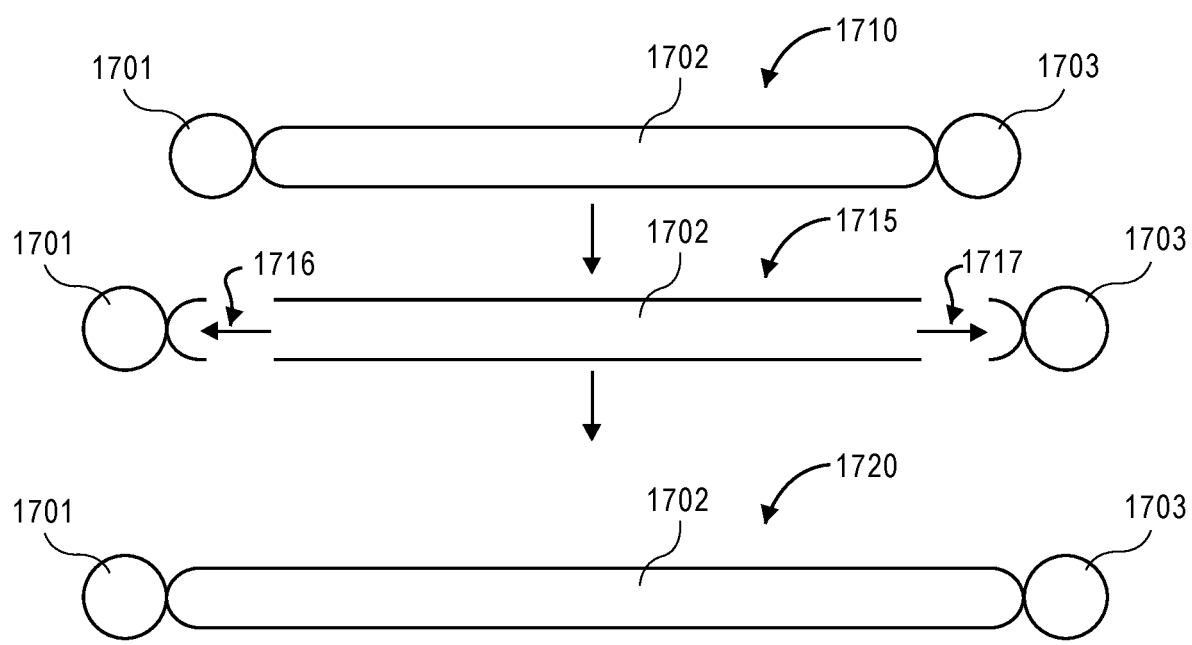

FIGS. 17A and 17B depict a design, elements thereof, and a modification(s) to certain of the elements. FIG. 17A depicts a design 1700 having a set of circle elements 1701, 1703, 1704, 1706, an element 1702 positioned between 1701 and 1703, and an element 1705 positioned between 1704 and 1706. Additionally, the design 1700 includes the text "Hello There" positioned between the elements 1702 and 1705.

FIG. 17B depicts a progression associated with a modification to certain elements of the design 1700. In particular, a first instance 1710 of the modification depicts the element 1702 positioned between the circle elements 1701 and 1703, where a user may want to extend the amount of length or space between the circle elements 1701 and 1703 (e.g., by extending the length of a corresponding container(s)). It may be assumed that each of the circle elements 1701 and 1703 has an element behavior that preserves the aspect ratio of the corresponding element 1701, 1703 (i.e., preserves the elements 1701, 1703 as circles), and that the element 1702 does not preserve the aspect ratio of the corresponding element 1702.

Accordingly, when the overall length is extended, the length of the circle elements 1701, 1703 do not extend because doing so would not preserve their aspect ratios. As depicted in the second instance 1715 of the modification, gaps 1716, 1717 exist between the element 1702 and the circle elements 1701, 1703, when the element 1702 does not extend in length. Accordingly, the element 1702 may have a "greedy" element behavior, defining that the element 1702 must consume any space between it and the circle elements 1701, 1703 created by a spatial adjustment (e.g., lengthening). It should be appreciated that a greedy element behavior may apply to one or more directions (e.g., x, y, left, right, up, and/or down). A third instance 1720 of the modification depicts the element 1702 extending to the circle elements 1701, 1703 in accordance with its greedy element behavior. Accordingly, the design may preserve its intended look.

FIGS. 18A-18C depict a design of a series of design elements (depicted as screw heads). FIG. 18A depicts an original design 1805 having fifteen (15) screw heads, each with an aspect ratio of one (1) (i.e., circular). The design 1805 may be contained within an outer boundary or container, and a user may wish to lengthen the outer container. FIG. 18B depicts a modified instance 1810 of the design in which the outer container is lengthened. If the design elements (i.e., the screw heads) do not have an element behavior of "preserve aspect ratio," the screw heads lengthen to fill the outer container and appear as distorted, as depicted in FIG. 18B.

In contrast, if the design elements have an element behavior of "preserve aspect ratio," the design elements do not lengthen and accordingly do not fill the empty space created by the lengthening of the outer container. Accordingly, a computing device may determine to add additional design elements (in this case, screw heads) to fill the empty space. FIG. 18C depicts another modified instance 1815 of the design in which eight (8) screw heads are added, for a total of twenty-three (23) screw heads, where each of the twenty-three (23) screw heads have a preserved aspect ratio of one.

Figure 19:
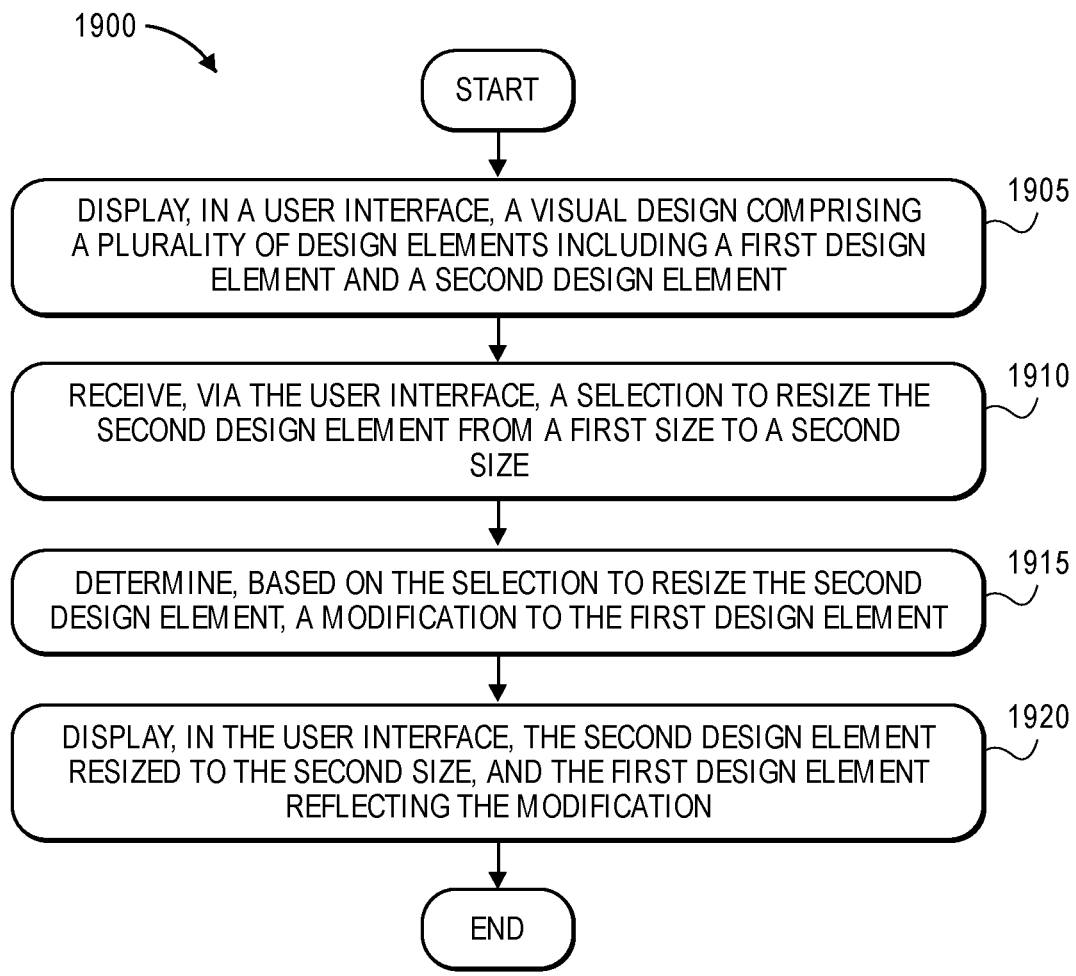
FIG. 19 depicts an example flow diagram associated with modifying a visual design comprising a plurality of design elements, in accordance with some embodiments.

FIG. 19 depicts is a block diagram of an example method 1900 for modifying a visual design comprising a plurality of design elements. The method 1900 may be facilitated by an electronic device (such as either of the devices 103, 105 as depicted in FIG. 1A) that may be in communication with a server (such as the central server 110 as discussed with respect to FIG. 1A). In embodiments, the method 1900 may be at least partially facilitated by a remote server, such as the central server 110 as discussed with respect to FIG. 1A.

The method 1900 may begin when the electronic device displays (1905), in a user interface, a visual design comprising a plurality of design elements including a first design element and a second design element. In embodiments, the first design element may have a registration with the second design element at a position of the second design element. Further, in embodiments, each of the plurality of design elements may have associated a characteristic(s) implemented as metadata, where the characteristic(s) of each design element defines how the design element can be modified. In a particular embodiment, the first design element may comprise textual data, and the registration of the first design element with the second design element at the position may be based on a justification of the textual data in the first design element.

The electronic device may receive (block 1910), via the user interface, a selection to resize the second design element from a first size to a second size. In embodiments, the second design element may be the outer boundary of the visual design, and the first design element may be contained within a portion of the visual design.

The electronic device may determine (block 1915), based on the selection to resize the second design element, a modification to the first design element. In embodiments, the electronic device may determine the modification based on the associated metadata of the first design element. For example, the associated metadata may effect a lock to an aspect ratio of the first design element, and the modification to the first design element may preserve the aspect ratio. For further example, the associated metadata may effect the first design element to consume space, and the modification to the first design element may consume space created by resizing the second design element to the second size.

It should be appreciated that other types of metadata and characteristics are envisioned (e.g., a fit characteristic, a fill characteristic, a distortion characteristic, etc.), where the second design element (and any additional design elements of the visual design) may have the same or different metadata and characteristics. In a particular embodiment, a third design element of the visual design may be contained within the second design element and may have a master image associated therewith.

The electronic device may display (block 1920), in the user interface, the second design element resized to the second size, and the first design element reflecting the modification. In an embodiment, if a third design element has a master image associated therewith, the electronic device may determine, from the master image and to accommodate the second design element being resized to the second size, an updated third design element, and display, in the user interface, the updated third design element.

Figure 20:
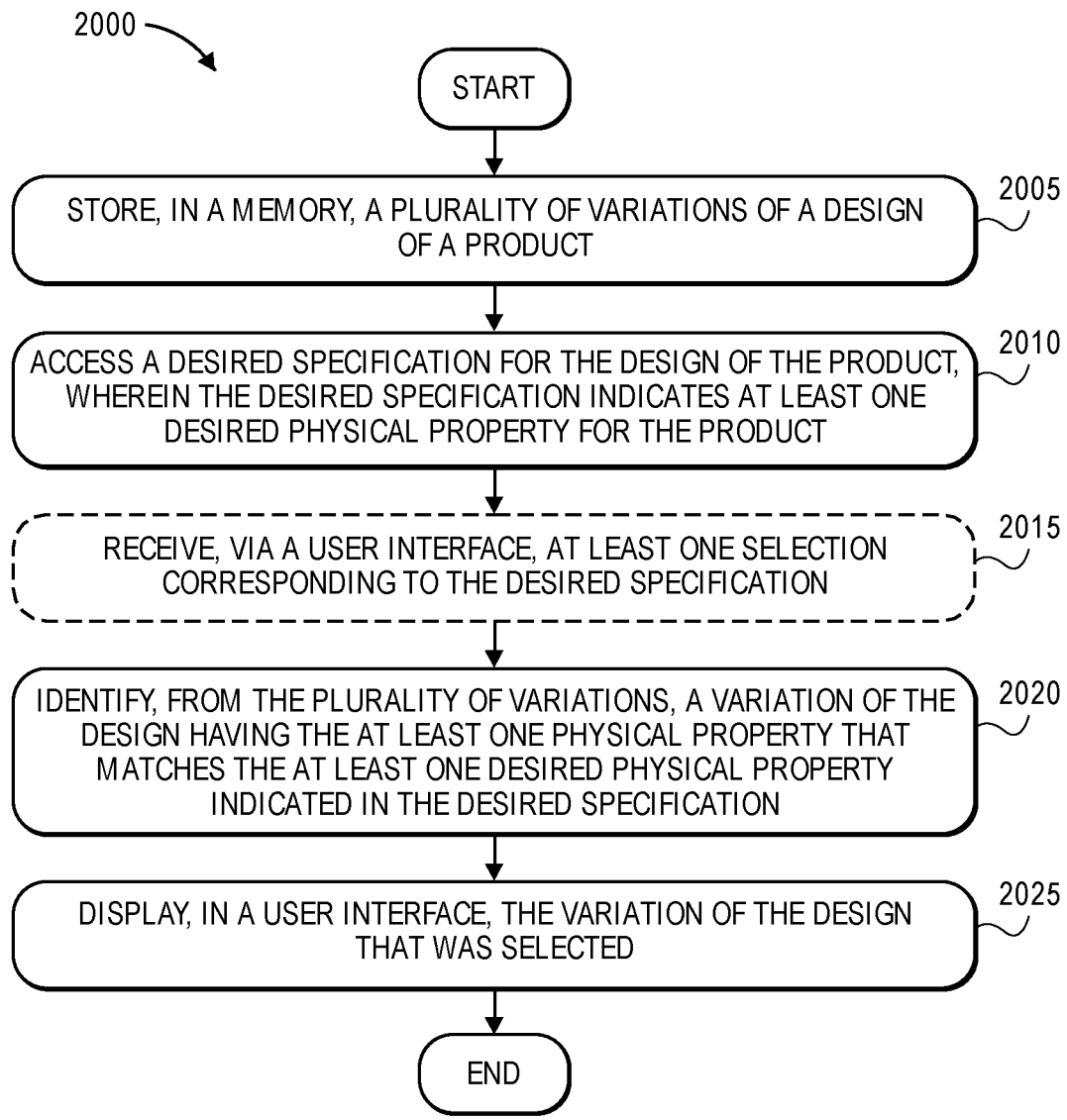
FIG. 20 depicts an example flow diagram associated with automatically selecting design variations of a product, in accordance with some embodiments.

FIG. 20 depicts a block diagram of an example method 2000 of automatically selecting design variations of a product. The method 2000 may be facilitated by an electronic device (such as either of the devices 103, 105 as depicted in FIG. 1A) that may be in communication with a server (such as the central server 110 as discussed with respect to FIG. 1A). In embodiments, the method 2000 may be at least partially facilitated by a remote server, such as the central server 110 as discussed with respect to FIG. 1A.

The method 2000 may begin when the electronic device stores (block 2005), in a memory, a plurality of variations of a design of a product. In embodiments, each variation of the plurality of variations may (i) include a plurality of design elements, (ii) define a spatial relationship between a first design element of the plurality of design elements and a second design element of the plurality of design elements, and (iii) indicate at least one physical property for the product.

The electronic device may access (block 2010) a desired specification for the design of the product, wherein the desired specification indicates at least one desired physical property for the product. In embodiments, the at least one desired physical property may include at least one of a height, a width, an aspect ratio, a size, an opacity, a shape, a decoration technology, and a substrate color. Additionally or alternatively, the at least one desired physical property may indicate a value (e.g., 3000 pixel width) and/or specify a desired type (e.g., a clear opacity).

The electronic device may optionally receive (block 2015), via a user interface, at least one selection corresponding to the desired specification. In particular, a user may use the electronic device to input and/or modify the at least one desired physical property for the product.

The electronic device may identify (block 2020), from the plurality of variations, a variation of the design having the at least one physical property that matches the at least one desired physical property indicated in the desired specification. In particular, if the at least one desired physical property indicates a value, the electronic device may determine that the at least one physical property of the variation has a range of values that matches the value, and/or if the at least one desired physical property specifies a desired type, the electronic device may determine that the at least one physical property of the variation has a type that matches the desired type. In embodiments, an amount of the at least one desired physical property of the desired specification may or may not match an amount of the least one physical property of the variation. For example, the desired specification may specify three (3) desired physical properties and the variation may have two (2) physical properties.

The electronic device may display (block 2025), in a user interface, the variation of the design that was selected. In particular, the electronic device may display, in the user interface, the first design element and the second design element defined by the variation of the design and according to the spatial relationship between the first design element and the second design element. In this regard, a user of the electronic device may review the variation, make any desired revisions or edits, or proceed to additional functionality (e.g., ordering a design of the product).

Figure 21:
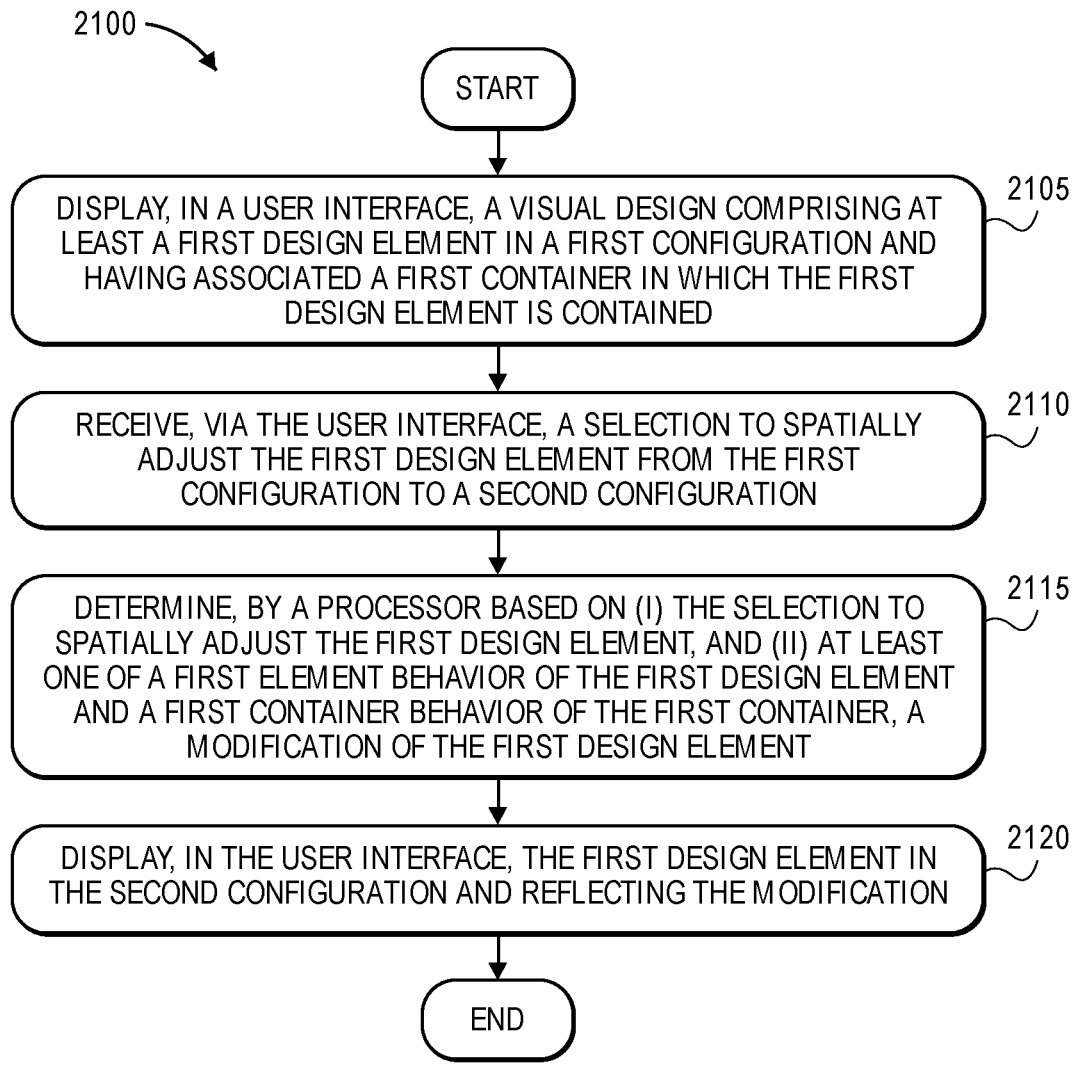
FIG. 21 depicts an example flow diagram associated with modifying a visual design, in accordance with some embodiments.

FIG. 21 depicts is a block diagram of an example method 2100 of modifying a visual design, where the visual design may include at least a first design element. The method 2100 may be facilitated by an electronic device (such as either of the devices 103, 105 as depicted in FIG. 1A) that may be in communication with a server (such as the central server 110 as discussed with respect to FIG. 1A). In embodiments, the method 2100 may be at least partially facilitated by a remote server, such as the central server 110 as discussed with respect to FIG. 1A.

The method 2100 may begin when the electronic device displays (block 2105), in a user interface, the visual design comprising at least the first design element in a first configuration and having associated a first container in which the first design element is contained. In embodiments, the first design element may have a first element behavior and the first container may have a first container behavior.

The electronic device may receive (block 2110), via the user interface, a selection to spatially adjust the first design element from the first configuration to a second configuration. In embodiments, the selection may be made to the first design element or the first container in which the first design element is contained.

The electronic device may determine (block 2115), by a processor based on (i) the selection to spatially adjust the first design element, and (ii) at least one of the first element behavior of the first design element and the first container behavior of the first container, a modification to the first design element. In embodiments, the electronic device may determine the modification based on both the first element behavior of the first design element and the first container behavior of the first container.

In an embodiment, the visual design may comprise a non-visual design element having a non-visual design element behavior, and the electronic device may determine, based on (i) the selection to spatially adjust the first design element, and (ii) the at least one of the first element behavior of the first design element and the first container behavior of the first container, to redistribute the first design element in association with the non-visual design element according to the non-visual design element behavior.

Additionally or alternatively, the first design element may comprise textual content, the first container behavior may define an aspect ratio, and the first element behavior may define a display angle for the textual content. Further, the electronic device may determine a modification to the display angle for the textual content based on (i) the selection to spatially adjust the first design element, and (ii) the aspect ratio of the first container behavior.

Additionally or alternatively, the first design element may comprise textual content, and the first element behavior may preserve a payload of the textual content within the first container. Further, the electronic device may determine, based on the selection to spatially adjust the first design element, the modification to preserve the payload of the textual content of the first design element within the first container.

Additionally or alternatively, the first design element may include a plurality of visual elements, and the first container behavior may either shed or nudge at least a portion of the plurality of visual elements. Further, the electronic device may determine, based on the selection to spatially adjust the first design element, the modification to either shed or nudge at least the portion of the plurality of visual elements.

Additionally or alternatively, the first design element may be a visual image, and the first container behavior may define at least a portion of the visual image for display. Further, the electronic device may determine, based on (i) the selection to spatially adjust the first design element, and (ii) at least the portion of the visual image for display defined by the first container behavior, the modification to the first design element.

Additionally or alternatively, the first design element may include a plurality of visual elements, and the first container behavior may adjust an amount of the plurality of visual elements. Further, the electronic device may determine, based on the selection to spatially adjust the first design element, the modification to adjust the amount of the plurality of visual elements.

The electronic device may display (block 2120), in the user interface, the first design element in the second configuration and reflecting the modification. In an embodiment, the visual design may further include a second design element having a second element behavior to fill space, and the first element behavior may preserve an aspect ratio of the first design element. Further, the electronic device may determine a second modification to the second design element to fill space created by the aspect ratio of the first design element being preserved in the modification to the first design element, and display, in the user interface, the second design element reflecting the second modification.

Figure 22:
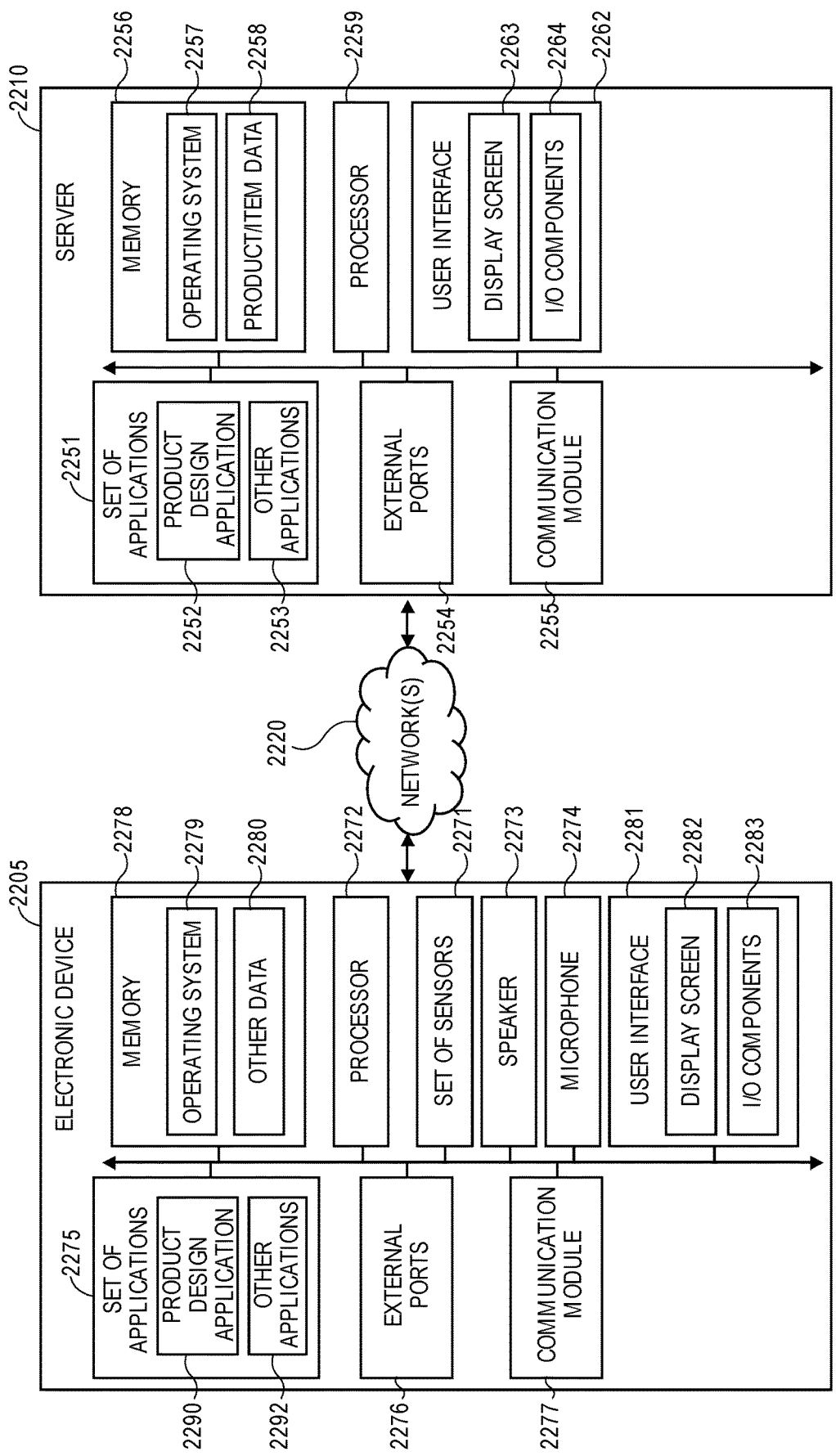
FIG. 22 is a block diagram of an example electronic device and an example server, in accordance with some embodiments.

FIG. 22 illustrates a hardware diagram of an example electronic device 2205 (such as the electronic device 203 as discussed with respect to FIG. 2) and an example server 2210 (such as the central server 110 as discussed with respect to FIG. 1), in which the functionalities as discussed herein may be implemented.

The electronic device 2205 may include a processor 2272 as well as a memory 2278. The memory 2278 may store an operating system 2279 capable of facilitating the functionalities as discussed herein as well as a set of applications 2275 (i.e., machine readable instructions). For example, one of the set of applications 2275 may be a product design application 2290 configured to facilitate certain product designing functionalities as discussed herein. It should be appreciated that one or more other applications 2292, such as a web browser application, are envisioned.

The processor 2272 may interface with the memory 2278 to execute the operating system 2279 and the set of applications 2275. According to some embodiments, the memory 2278 may also store other data 2280 that may include data accessed or collected by various sensors. The memory 2278 may include one or more forms of volatile and/or non-volatile, fixed and/or removable memory, such as read-only memory (ROM), electronic programmable read-only memory (EPROM), random access memory (RAM), erasable electronic programmable read-only memory (EEPROM), and/or other hard drives, flash memory, MicroSD cards, and others.

The electronic device 2205 may further include a communication module 2277 configured to communicate data via one or more networks 2220. According to some embodiments, the communication module 2277 may include one or more transceivers (e.g., WWAN, WLAN, and/or WPAN transceivers) functioning in accordance with IEEE standards, 3GPP standards, or other standards, and configured to receive and transmit data via one or more external ports 2276.

The electronic device 2205 may include a set of sensors 2271 such as, for example, a location module (e.g., a GPS chip), an image sensor, an accelerometer, a clock, a gyroscope (i.e., an angular rate sensor), a compass, a yaw rate sensor, a tilt sensor, telematics sensors, and/or other sensors. The electronic device 2205 may further include a user interface 2281 configured to present information to a user and/or receive inputs from the user. As shown in FIG. 22, the user interface 2281 may include a display screen 2282 and I/O components 2283 (e.g., ports, capacitive or resistive touch sensitive input panels, keys, buttons, lights, LEDs). According to some embodiments, the user may access the electronic device 2205 via the user interface 2281 to review information such product renderings, make design selections and modifications, and/or perform other functions. Additionally, the electronic device 2205 may include a speaker 2273 configured to output audio data and a microphone 2274 configured to detect audio.

In some embodiments, the electronic device 2205 may perform the functionalities as discussed herein as part of a "cloud" network or may otherwise communicate with other hardware or software components within the cloud to send, retrieve, or otherwise analyze data.

As illustrated in FIG. 22, the electronic device 2205 may communicate and interface with the server 2210 via the network(s) 2220. The server 2210 may include a processor 2259 as well as a memory 2256. The memory 2256 may store an operating system 2257 capable of facilitating the functionalities as discussed herein as well as a set of applications 2251 (i.e., machine readable instructions). For example, one of the set of applications 2251 may be a product design application 2252 configured to facilitate various of the product design functionalities discussed herein. It should be appreciated that one or more other applications 2253 are envisioned.

The processor 2259 may interface with the memory 2256 to execute the operating system 2257 and the set of applications 2251. According to some embodiments, the memory 2256 may also store product/item data 2258, such as data or information associated with products and items that may be offered for sale. The memory 2256 may include one or more forms of volatile and/or non-volatile, fixed and/or removable memory, such as read-only memory (ROM), electronic programmable read-only memory (EPROM), random access memory (RAM), erasable electronic programmable read-only memory (EEPROM), and/or other hard drives, flash memory, MicroSD cards, and others.

The server 2210 may further include a communication module 2255 configured to communicate data via the one or more networks 2220. According to some embodiments, the communication module 2255 may include one or more transceivers (e.g., WWAN, WLAN, and/or WPAN transceivers) functioning in accordance with IEEE standards, 3GPP standards, or other standards, and configured to receive and transmit data via one or more external ports 2254. For example, the communication module 2255 may receive, from the electronic device 2205, requests for certain design elements.

The server 2210 may further include a user interface 2262 configured to present information to a user and/or receive inputs from the user. As shown in FIG. 22, the user interface 2262 may include a display screen 2263 and I/O components 2264 (e.g., ports, capacitive or resistive touch sensitive input panels, keys, buttons, lights, LEDs). According to some embodiments, the user may access the server 2210 via the user interface 2262 to review information, make changes, and/or perform other functions.

In some embodiments, the server 2210 may perform the functionalities as discussed herein as part of a "cloud" network or may otherwise communicate with other hardware or software components within the cloud to send, retrieve, or otherwise analyze data.

In general, a computer program product in accordance with an embodiment may include a computer usable storage medium (e.g., standard random access memory (RAM), an optical disc, a universal serial bus (USB) drive, or the like) having computer-readable program code embodied therein, wherein the computer-readable program code may be adapted to be executed by the processors 2272, 2259 (e.g., working in connection with the respective operating systems 2279, 2257) to facilitate the functions as described herein. In this regard, the program code may be implemented in any desired language, and may be implemented as machine code, assembly code, byte code, interpretable source code or the like (e.g., via Golang, Python, Scala, C, C++, Java, Actionscript, Objective-C, Javascript, CSS, XML). In some embodiments, the computer program product may be part of a cloud network of resources.

Although the following text sets forth a detailed description of numerous different embodiments, it should be understood that the legal scope of the invention may be defined by the words of the claims set forth at the end of this patent. The detailed description is to be construed as exemplary only and does not describe every possible embodiment, as describing every possible embodiment would be impractical, if not impossible. One could implement numerous alternate embodiments, using either current technology or technology developed after the filing date of this patent, which would still fall within the scope of the claims.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Additionally, certain embodiments are described herein as including logic or a number of routines, subroutines, applications, or instructions. These may constitute either software (e.g., code embodied on a non-transitory, machine-readable medium) or hardware. In hardware, the routines, etc., are tangible units capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that may be permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that may be temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

Accordingly, the term "hardware module" should be understood to encompass a tangible entity, be that an entity that is physically constructed, permanently configured (e.g., hardwired), or temporarily configured (e.g., programmed) to operate in a certain manner or to perform certain operations described herein. Considering embodiments in which hardware modules are temporarily configured (e.g., programmed), each of the hardware modules need not be configured or instantiated at any one instance in time. For example, where the hardware modules comprise a general-purpose processor configured using software, the general-purpose processor may be configured as respective different hardware modules at different times. Software may accordingly configure a processor, for example, to constitute a particular hardware module at one instance of time and to constitute a different hardware module at a different instance of time.

Hardware modules may provide information to, and receive information from, other hardware modules. Accordingly, the described hardware modules may be regarded as being communicatively coupled. Where multiple of such hardware modules exist contemporaneously, communications may be achieved through signal transmission (e.g., over appropriate circuits and buses) that connect the hardware modules. In embodiments in which multiple hardware modules are configured or instantiated at different times, communications between such hardware modules may be achieved, for example, through the storage and retrieval of information in memory structures to which the multiple hardware modules have access. For example, one hardware module may perform an operation and store the output of that operation in a memory device to which it may be communicatively coupled. A further hardware module may then, at a later time, access the memory device to retrieve and process the stored output. Hardware modules may also initiate communications with input or output devices, and may operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

Similarly, the methods or routines described herein may be at least partially processor-implemented. For example, at least some of the operations of a method may be performed by one or more processors or processor-implemented hardware modules. The performance of certain of the operations may be distributed among the one or more processors, not only residing within a single machine, but deployed across a number of machines. In some example embodiments, the processor or processors may be located in a single location (e.g., within a home environment, an office environment, or as a server farm), while in other embodiments the processors may be distributed across a number of locations.

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment may be included in at least one embodiment. The appearances of the phrase "in one embodiment" in various places in the specification are not necessarily all referring to the same embodiment.

As used herein, the terms "comprises," "comprising," "may include," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the description. This description, and the claims that follow, should be read to include one or at least one and the singular also may include the plural unless it is obvious that it is meant otherwise.

This detailed description is to be construed as examples and does not describe every possible embodiment, as describing every possible embodiment would be impractical.

What is claimed is:

1. A computer-implemented method of modifying a visual design comprising a design element, the method comprising:
   displaying, in a user interface, the visual design comprising at least the design element in a first configuration and having associated a container in which the design element is contained, wherein the design element comprises textual content and has an element behavior that preserves a payload of the textual content within the container, and wherein the container that contains the design element in the first configuration has a first amount of rows;
   receiving, via the user interface, a selection to spatially adjust the design element from the first configuration to a second configuration, the second configuration resulting in a modified container for the design element;
   determining, by a processor based on the selection to spatially adjust the design element, a modification to the design element to preserve the payload of the textual content of the design element within the modified container, including:
      determining an amount of characters included in the textual content,
      determining, based on the amount of characters included in the textual content, (i) a second amount of rows that fit within the modified container, and (ii) an amount of spaces per row of the second amount of rows, wherein the second amount of rows is different than the first amount of rows, and
      determining that a size of the textual content fitting in the second amount of rows and the amount of spaces per row is larger than a size of the textual content fitting in the first amount of rows; and
   displaying, in the user interface, the design element in the second configuration and reflecting (i) the payload of the textual content of the design element being preserved within the modified container and (ii) the textual content fitting in the second amount of rows.

2. The computer-implemented method of claim 1, wherein the container that contains the design element in the first configuration has a first amount of spaces in each row of the first amount of rows.

3. The computer-implemented method of claim 2, wherein the first amount of spaces is different than the amount of spaces.

4. An electronic device for modifying a visual design comprising a design element, comprising:
   a user interface for displaying content;
   a memory storing non-transitory computer executable instructions; and
   a processor interfacing with the user interface and the memory, wherein the processor is configured to execute the non-transitory computer executable instructions to cause the processor to:
      cause the user interface to display the visual design comprising at least the design element in a first configuration and having associated a container in which the design element is contained, wherein the design element comprises textual content and has an element behavior that preserves a payload of the textual content within the container, and wherein the container that contains the design element in the first configuration has a first amount of rows,
      receive, via the user interface, a selection to spatially adjust the design element from the first configuration to a second configuration, the second configuration resulting in a modified container for the design element,
      determine, based on the selection to spatially adjust the design element, a modification to the design element to preserve the payload of the textual content of the design element within the modified container, including:
         determine an amount of characters included in the textual content,
         determine, based on the amount of characters included in the textual content, (i) a second amount of rows that fit within the modified container, and (ii) an amount of spaces per row of the second amount of rows, wherein the second amount of rows is different than the first amount of rows, and determine that a size of the textual content fitting in the second amount of rows and the amount of spaces per row is larger than a size of the textual content fitting in the first amount of rows, and cause the user interface to display the design element in the second configuration and reflecting (i) the payload of the textual content of the design element being preserved within the modified container and (ii) the textual content fitting in the second amount of rows.

5. The electronic device of claim 4, wherein the container that contains the design element in the first configuration has a first amount of spaces in each row of the first amount of rows.

6. The electronic device of claim 5, wherein the first amount of spaces is different than the amount of spaces.

7. A non-transitory computer-readable storage medium configured to store instructions executable by a computer processor, the instructions comprising:

instructions for displaying, in a user interface, a visual design comprising at least a design element in a first configuration and having associated a container in which the design element is contained, wherein the design element comprises textual content and has an element behavior that preserves a payload of the textual content within the container, and wherein the container that contains the design element in the first configuration has a first amount of rows;

instructions for receiving, via the user interface, a selection to spatially adjust the design element from the first configuration to a second configuration, the second configuration resulting in a modified container for the design element;

instructions for determining, based on the selection to spatially adjust the design element, a modification to the design element to preserve the payload of the textual content of the design element within the modified container, including:

instructions for determining an amount of characters included in the textual content, instructions for determining, based on the amount of characters included in the textual content, (i) a second amount of rows that fit within the modified container, and (ii) an amount of spaces per row of the second amount of rows, wherein the second amount of rows is different than the first amount of rows, and instructions for determining that a size of the textual content fitting in the second amount of rows and the amount of spaces per row is larger than a size of the textual content fitting in the first amount of rows; and instructions for displaying, in the user interface, the design element in the second configuration and reflecting (i) the payload of the textual content of the design element being preserved within the modified container and (ii) the textual content fitting in the second amount of rows.

8. The non-transitory computer-readable storage medium of claim 7, wherein the container that contains the design element in the first configuration has a first amount of spaces in each row of the first amount of rows.

9. The non-transitory computer-readable storage medium of claim 8, wherein the first amount of spaces is different than the amount of spaces.

* * * * *